United States Patent
Sumiya et al.

(10) Patent No.: US 7,272,876 B2
(45) Date of Patent: Sep. 25, 2007

(54) METHOD FOR FABRICATING LAMINATE-TYPE DIELECTRIC ELEMENT

(75) Inventors: Atsuhiro Sumiya, Hekinan (JP); Eturo Yasuda, Okazaki (JP); Hitoshi Shindo, Okazaki (JP); Akira Fujii, Yokkaichi (JP); Takashi Yamamoto, Chiryu (JP); Toshiatsu Nagaya, Kuwana (JP); Kumi Sawaguchi, Okazaki (JP); Ryoji Kai, Okazaki (JP)

(73) Assignees: Nippon Soken, Inc. (JP); DENSO Corporation (JP)

( * ) Notice: Subject to any disclaimer, the term of this patent is extended or adjusted under 35 U.S.C. 154(b) by 399 days.

(21) Appl. No.: 10/700,371

(22) Filed: Nov. 4, 2003

(65) Prior Publication Data

US 2004/0139599 A1    Jul. 22, 2004

(30) Foreign Application Priority Data

Nov. 5, 2002  (JP) ............................. 2002-321395
Oct. 15, 2003  (JP) ............................. 2003-355444

(51) Int. Cl.
*H01G 7/00*  (2006.01)

(52) U.S. Cl. ................... 29/25.35; 29/25.41; 29/25.42; 156/89.12

(58) Field of Classification Search ................ 29/825, 29/830, 25.35, 25.42, 842, 846; 361/311, 361/321.2, 321.5; 156/89.12; 333/304, 333/319
See application file for complete search history.

(56) References Cited

U.S. PATENT DOCUMENTS 4,586,972 A *  5/1986  Yokotani et al. ......... 156/89.12
4,977,485 A * 12/1990  Mori et al. ............... 361/321.4
5,273,943 A     12/1993  Kameyama et al.

(Continued)

FOREIGN PATENT DOCUMENTS

DE        195 48 351          6/1996

(Continued)

OTHER PUBLICATIONS

German Office Action dated Dec. 22, 2006 issued in counterpart German Application No. 103 51 377.9-34 with English translation.

*Primary Examiner*—Minh Trinh
(74) *Attorney, Agent, or Firm*—Nixon & Vanderhye PC

(57) ABSTRACT

A method of producing a laminated dielectric element of high quality, free of delamination. A method of producing a laminated dielectric element 1 by alternately laminating dielectric ceramic layers 12 and base metal electrode layers 13, comprising the steps of printing electrodes by applying a paste material for the base metal electrodes onto the surfaces of at least one side of the ceramic green sheets, laminating and press-adhering the ceramic green sheets to fabricate a laminate thereof, dewaxing the laminate, reducing the electrodes to form base metal electrode layers by heating the laminate while flowing an atmospheric gas and by reducing the paste material for the base metal electrodes, and sintering the laminate. In the step of reducing the electrodes, the paste material for the base metal electrodes is so reduced that the amount of the base metal oxide remaining in the base metal electrode layers is not larger than 20% by weight and that the amount of lead liberated from the ceramic material is not larger than 30 atomic % within 5000 Å from the surfaces of the base metal electrode layers.

11 Claims, 17 Drawing Sheets

U.S. PATENT DOCUMENTS

| | | | |
|---|---|---|---|
| 5,485,950 A * | 1/1996 | Shibata et al. | 228/194 |
| 5,680,291 A | 10/1997 | Kim et al. | |
| 6,485,591 B1 * | 11/2002 | Nakao et al. | 156/89.12 |
| 7,083,745 B2 * | 8/2006 | Shindo et al. | 252/518.1 |
| 2002/0121329 A1 | 9/2002 | Shindo et al. | |

FOREIGN PATENT DOCUMENTS

| | | |
|---|---|---|
| DE | 693 10 575 | 9/1997 |
| DE | 101 64 314 | 8/2002 |
| JP | 01-230214 | 9/1989 |
| JP | 5-82387 | 4/1993 |
| JP | 7-34417 | 4/1995 |
| JP | 2002-255646 | 9/2002 |

* cited by examiner

Cu DISTRIBUTION (SAMPLE E1)

Cu DISTRIBUTION (SAMPLE C3)

METHOD FOR FABRICATING LAMINATE-TYPE DIELECTRIC ELEMENT

BACKGROUND OF THE INVENTION

1. Field of the Invention

The present invention relates to a laminated dielectric element such as a laminated ceramic capacitor, a laminated piezo-electric actuator or the like and to a method of producing the same.

2. Description of the Related Art

Laminated dielectric elements obtained by alternately laminating dielectric ceramic layers made of a PZT-type material having excellent dielectric properties and base metal electrode layers of a base metal such as copper or the like, have heretofore been widely utilized for capacitors and actuators.

The laminated dielectric elements are usually produced through a plurality of steps as described below.

First, a green sheet is prepared by using a ceramic material such as PZT, and a paste electrode material of a metal oxide is applied onto the green sheet by screen-printing or the like method. Next, the green sheets on which the paste electrode material is applied are laminated to prepare a laminate thereof, which is then dewaxed.

Then, the laminate after being dewaxed is heated in a heating furnace under reducing conditions to reduce the metal oxide in the paste electrode material and to form metal electrode layers having electric conduction (step of reducing the electrodes). Thereafter, the laminate is sintered to increase the density of the ceramic material to finally obtain a laminated dielectric element (step of sintering).

In the above step of sintering, however, the paste electrode material and the ceramic material require conflicting atmospheric conditions. That is, the ceramic material such as PZT which is an oxide can be favorably sintered in an oxidizing atmosphere, whereas the paste material is better sintered in a reducing atmosphere to maintain electric conduction obtained through the step of reducing the electrodes.

Therefore, if the step of sintering is conducted in an oxidizing atmosphere to fire the ceramic material to a sufficient degree, then the metal electrode layers of copper or the like, that are reduced in advance in the step of reducing the electrodes, are oxidized again causing the electric conduction to be decreased. If the sintering is conducted in a reducing atmosphere, on the other hand, the ceramic material is reduced, and properties of the laminate after sintering deteriorate.

In order to solve the above problem, there has been proposed a method according to which an electrically conducting paste is reduced in an atmosphere containing a hydrogen gas and, in a subsequent step of sintering, the laminate is sintered in an atmosphere in which the oxygen partial pressure is controlled to lie in a particular range (see Japanese Unexamined Patent Publication (Kokai) No. 5-82387).

There has further been proposed a method in which an electrically conducting paste is reduced at a temperature lower than the sintering temperature, and in a subsequent step of sintering, the laminate is sintered in an atmosphere in which the $O_2$ partial pressure is controlled to lie within a particular range by using an $N_2$—$H_2$—$H_2O$ mixed gas (see Japanese Unexamined Patent Publication (Kokai) No. 7-34417).

According to the above-mentioned conventional methods, the density of the ceramic material can be increased almost without oxidizing the metal electrodes of copper or the like reduced in the step of reducing the electrodes in spite of having conducted the step of sintering.

In the above step of reducing the electrodes, however, there exist two reactions, i.e., a reducing reaction based on a theory of chemical equilibrium and a reducing reaction based on a theory of reaction rate, in which the above conventional methods are not suitable.

Let the case now be considered of producing the device by using a conducting paste containing, for example, a Cu oxide and a ceramic material of PZT material. Then, in the step of reducing the electrodes, there exist a Cu oxide-reducing reaction based on the theory of chemical equilibrium ($2Cu_xO \leftrightarrow 2xCu + O_2$) and a Cu oxide-reducing reaction based on the theory of reaction rate by hydrogen gas ($Cu_xO + H_2 \Rightarrow xCu + H_2O$).

According to the reaction based on the theory of reaction rate between the above two reactions, the Cu oxide is not reduced but remains in the conducting paste when the concentration or amount of hydrogen gas is small. When the concentration or amount of hydrogen gas is large, on the other hand, the Cu oxide is reduced and the PZT is reduced, too, in the ceramic material, releasing Pb and the like from the composition, which is not desirable.

When the Cu oxide is not reduced but remains as described above, $Cu_2O$ which is a Cu oxide that remains reacts with PbO and the like remaining in small amounts in the ceramic material such as PZT to form a eutectic material of liquid phase in the step of sintering, and this liquid phase diffuses in the ceramic material. Therefore, there is a problem of a decrease in the insulating resistance after sintering. Further, a portion where the liquid phase has occurred tends to be contracted as compared to the surrounding areas, giving rise to the problem of delamination during the sintering.

When Pb is released from the composition as a result of reducing the PZT, on the other hand, Pb that is released and Cu formed by reduction in the step of reducing the electrodes may form a eutectic material of liquid phase at temperatures of not lower than 327° C. which is a eutectic point thereof. As a result, in the above sintering step of effecting the heat treatment at a high temperature, the metal electrodes may dissolve. Further, since the portion where the liquid phase is formed tends to be more contracted than the surrounding areas, there is a problem of delamination occurring during the step of sintering.

The occurrence of delamination degrades important characteristics of the laminated dielectric element such as Young's modulus, insulation resistance, etc.

SUMMARY OF THE INVENTION

The present invention was accomplished in view of the above-mentioned problems inherent in the prior art, and provides a laminated dielectric element of high quality free of delamination and a method of producing the same.

A first invention is concerned with a method of producing a laminated dielectric element by alternately laminating dielectric ceramic layers containing lead in the composition thereof and base metal electrode layers of a base metal, comprising the steps of:

printing electrodes by applying a paste material for the base metal electrodes containing an oxide of a base metal onto the surfaces of at least one side of the ceramic green sheets obtained by molding a ceramic material of a metal oxide containing lead oxide into the form of a sheet;

laminating and press-adhering the ceramic green sheets onto which the paste material for the base metal electrodes is applied to fabricate a laminate thereof;

reducing the electrodes to form base metal electrode layers by heating the laminate in a heating furnace while flowing an atmospheric gas and by reducing the paste material for the base metal electrodes; and sintering the laminate;

wherein in the step of reducing the electrodes, the paste material for the base metal electrodes is so reduced that the amount of the base metal oxide remaining in the base metal electrode layers is not larger than 20% by weight and that the amount of lead released from the ceramic material is not larger than 30 atomic % within 5000 Å from the surfaces of the base metal electrode layers.

According to the above first invention, attention is given to the fact that one of the causes of delamination that occurs during the step of sintering resides in the step of reducing the electrodes which is conducted prior to the step of sintering, and hence the paste material for the base metal electrodes is reduced in the step of reducing the electrodes under the above-mentioned particular conditions.

In the step of reducing the electrodes, the paste material for the base metal electrodes is so reduced that the amount of the base metal oxide remaining in the base metal electrode layers is not larger than 20% by weight and that the amount of lead released from the ceramic material is not larger than 30 atomic % within 5000 Å from the surfaces of the base metal electrode layers.

By suppressing the amount of the base metal oxide remaining in the step of reducing the electrodes to be not larger than 20% by weight, the base metal oxide that is remaining does not react with the metal oxide containing the lead oxide in the ceramic material, preventing the formation of eutectic material of liquid phase. Therefore, the liquid phase does not diffuse into the ceramic material and the insulating resistance does not decrease after sintering. In addition, delamination does not occur.

Further, by suppressing the amount of lead released from the ceramic material so as not to be larger than 30 atomic % within 5000 Å from the surfaces of the base metal electrode layers, lead liberated from the ceramic material does not react with the base metal contained in the base metal electrode layers during the step of sintering, and the base metal electrode layers are prevented from being dissolved.

Here, the amount of the base metal oxide remaining in the step of reducing the electrodes is suppressed to be not larger than 20% by weight.

When the amount of the base metal oxide remains in an amount of not smaller than 20% by weight, the base metal oxide that remains reacts with the metal oxide containing the lead oxide in the ceramic material to form a eutectic material of liquid phase. As a result, the insulating resistance of the laminate may decrease after the step of sintering, and delamination may occur.

Further, the amount of lead released from the ceramic material is suppressed to be not larger than 30 atomic % within 5000 Å from the surfaces of the base metal electrode layers.

When the amount of lead released from the ceramic material exceeds 30 atomic % within the above range, lead that is released may react with the base metal in the base metal electrode layers causing the base metal electrode layers to be dissolved. Therefore, the base metal electrode layers may lose electric conduction, and delamination may occur due to the formation of a liquid phase.

According to the present invention as described above, there is provided a method of producing a laminated dielectric element of high quality free of delamination.

A second invention is concerned with a method of producing a laminated dielectric element by alternately laminating dielectric ceramic layers containing lead in the composition thereof and base metal electrode layers of a base metal, comprising the steps of:

printing electrodes by applying a paste material for the base metal electrodes containing an oxide of a base metal onto the surfaces of at least one side of ceramic green sheets obtained by molding, into the form of a sheet, a ceramic material of a metal oxide containing a lead oxide;

laminating and press-adhering the ceramic green sheets onto which the paste material for the base metal electrodes is applied to fabricate a laminate thereof;

reducing the electrodes to form base metal electrode layers by heating the laminate in a heating furnace while flowing an atmospheric gas and by reducing the paste material for the base metal electrodes; and sintering the laminate;

wherein in the step of reducing the electrodes, if the amount of the base metal oxide remaining in the base metal electrode layers is denoted by M (% by weight) (where the remaining amount M is determined by a thin-film X-ray diffraction method) and if the amount of lead released from the ceramic material within 5000 Å from the surfaces of the base metal electrode layers is denoted by N (atomic %)(where the amount N of lead is determined by an X-ray photoelectron spectroscopic method within a range of 5000 Å from the surfaces of the base metal electrode layers), then there holds a relationship, $$N = C \times M + D, \ 0 \leq M < 20$$

where C and D are values independent from M and N, and lie within ranges of $-1.5 \leq C < -1.0$ and $30 \leq D < 36$, respectively, between M (% by weight) and N (atomic %).

According to the above second invention, attention is given to the fact that one of the causes of delamination that occurs during the step of sintering resides in the step of reducing the electrodes which is conducted prior to the step of sintering, and hence the paste material for the base metal electrodes is reduced in the step of reducing the electrodes under the above-mentioned particular conditions.

Concretely speaking, in the step of reducing the electrodes, the paste material for the base metal electrodes is so reduced that the amount of the base metal oxide remaining in the base metal electrode layers is not larger than 20% by weight and that the amount M of lead released from the ceramic material is equal to $C \times N + D$ within 5000 Å from the surfaces of the base metal electrode layers. Here, C assumes a suitable value in a range of $-1.5 \leq C < -1.0$ and D assumes a suitable value in a range of $30 \leq D < 36$.

Further, the amount N that is remaining is determined by the thin-film X-ray diffraction method, and the amount M of lead is determined by the X-ray photoelectron spectroscopic method. As a measuring instrument used for the thin-film X-ray diffraction method, there can be used XRD 6100 or the like manufactured by Shimazu Seisakusho Co. Further, as a measuring instrument used for the X-ray photoelectron spectroscopic method, there can be used a measuring instrument manufactured by VG Systems Japan Co.

By suppressing the amount of the base metal oxide remaining in the step of reducing the electrodes to be not larger than 20% by weight, the base metal oxide that remains does not react with the metal oxide containing the lead oxide in the ceramic material, thus preventing the formation of eutectic material of liquid phase. Therefore, the liquid phase does not diffuse into the ceramic material and the insulating resistance does not decrease after sintering. In addition, delamination does not occur.

Further, by suppressing the amount M of lead released from the ceramic material to be equal to C×N+D (atomic %) within 5000 Å from the surfaces of the base metal electrode layers, lead liberated from the ceramic material does not react with the base metal contained in the base metal electrode layers during the step of sintering, and the base metal electrode layers are prevented from being dissolved.

Here, the amount of the base metal oxide remaining in the step of reducing the electrodes is suppressed to be not larger than 20% by weight.

When the amount of the base metal oxide remaining is in an amount of not smaller than 20% by weight, the base metal oxide that remains reacts with the metal oxide containing the lead oxide in the ceramic material to form a eutectic material of liquid phase. As a result, the insulation resistance of the laminate may decrease after the step of sintering, and delamination may occur.

Further, the amount M of lead released from the ceramic material is suppressed to be equal to C×N+D (atomic %) within 5000 Å from the surfaces of the base metal electrode layers, C and D being −1.5≦C<−1.0 and 30≦D<36.

When the amount of lead released from the ceramic material within the above range is C×N+D (atomic %), lead that is released may react with the base metal in the base metal electrode layers, and the base metal electrode layers may dissolve. Therefore, the base metal electrode layers may lose electric conduction and there may occur delamination due to the formation of a liquid phase.

According to the present invention as described above, there is provided a method of producing a laminated dielectric element of high quality free of delamination.

A third invention is concerned with a method of producing a laminated dielectric element by alternately laminating dielectric ceramic layers and base metal electrode layers of a base metal, comprising the steps of:

printing electrodes by applying a paste material for the base metal electrodes containing an oxide of a base metal onto the surfaces of at least one side of ceramic green sheets obtained by molding, into the form of a sheet, a ceramic material;

laminating and press-adhering the ceramic green sheets onto which the paste material for the base metal electrodes is applied to fabricate a laminate thereof;

reducing the electrodes to form base metal electrode layers by heating the laminate while flowing an atmospheric gas and by reducing the paste material for the base metal electrodes; and sintering the laminate;

wherein in the step of reducing the electrodes, the atmospheric gas contains a reducing gas for reducing the paste material for the base metal electrodes and an oxidizing gas of oxygen and/or a gas that forms oxygen; and in the step of reducing the electrodes, the heating is conducted with the temperature near a eutectic point of the base metal in the paste material for the base metal electrodes and of at least one metal in the ceramic green sheets as a maximum holding temperature, and the reducing gas at the maximum holding temperature is contained in an amount of not smaller than 0.2% by volume but not larger than 3% by volume in the atmospheric gas.

In this invention, what is most notable is that in the step of reducing the electrodes, the heating is conducted with the temperature near a eutectic point of the base metal in the paste material for the base metal electrodes and of at least one metal in the ceramic green sheets as a maximum holding temperature, and the reducing gas at the maximum holding temperature is contained in an amount of not smaller than 0.2% by volume but not larger than 3% by volume in the atmospheric gas.

In the step of reducing the electrode, the laminate is heated while flowing the atmospheric gas and raising the temperature at a predetermined rate. When a predetermined temperature (maximum holding temperature) is reached, this temperature is maintained and the paste material for the base metal electrodes is reduced.

In this invention, the maximum holding temperature is set to be near the eutectic point of the base metal in the paste material for the base metal electrodes and of at least one metal in the ceramic green sheet. Further, the content of the reducing gas in the atmospheric gas is set to lie within the above range.

Upon simultaneously satisfying the above two requirements, the base metal in the paste material for the base metal electrodes does not react with at least one metal in the ceramic green sheets, and a liquid phase (eutectic material) is scarcely formed. Therefore, the occurrence of delamination is prevented Further, upon controlling the reducing gas to lie within the above range, the paste material for the base metal electrodes can be sufficiently reduced in the step of reducing the electrodes while preventing the ceramic material from being reduced. Accordingly, no eutectic material is formed, and properties of the dielectric ceramic layer are scarcely degraded. Hence, it is possible to produce a laminated dielectric element featuring excellent properties such as Young's modulus, insulating resistance, etc.

Here, the reducing gas at the maximum holding temperature is contained in an amount of not smaller than 0.2% by volume but not larger than 3% by volume in the atmospheric gas.

When the reducing gas is contained in an amount of not larger than 0.2% by volume, the paste material for the base metal electrodes is not sufficiently reduced, and base metal electrode layers having electrically conducting property may not be formed. Further, the base metal oxide may remain in the paste material for the base metal electrodes, and may form a eutectic material together with the metal oxide in the ceramic material.

On the other hand, when the reducing gas is contained in an amount of not smaller than 3% by volume, the metal oxide in the ceramic material, too, may be reduced, spoiling the dielectric property and piezo-electric property. Further, when the metal oxide in the ceramic material is reduced and a metal is released, the metal oxide may undergo a eutectic reaction with the metal in the base metal electrode layers, whereby the base metal electrode layers may melt at low temperatures to form island-like electrodes.

A fourth invention is concerned with a method of producing a laminated dielectric element by alternately laminating dielectric ceramic layers and base metal electrode layers of a base metal, comprising the steps of:

printing electrodes by applying a paste material for the base metal electrodes containing an oxide of a base metal onto the surfaces of at least one side of ceramic green sheets obtained by molding, into the form of a sheet, a ceramic material;

laminating and press-adhering the ceramic green sheets onto which the paste material for the base metal electrodes is applied to fabricate a laminate thereof;

reducing the electrodes to form base metal electrode layers by heating the laminate while flowing an atmospheric gas and by reducing the paste material for the base metal electrodes; and sintering the laminate;

wherein in the step of reducing the electrodes, the atmospheric gas contains a reducing gas for reducing the paste material for the base metal electrodes and an oxidizing gas of oxygen and/or a gas that forms oxygen; and in the step of reducing the electrodes, the heating is conducted with the temperature near a eutectic point of the base metal in the paste material for the base metal electrodes and of at least one metal in the ceramic green sheets as a maximum holding temperature, and the reducing gas in the atmospheric gas at the maximum holding temperature is permitted to flow at a linear density of not smaller than 0.0376 cm/min but not larger than 0.564 cm/min.

In the fourth invention, the maximum holding temperature in the step of reducing the electrodes is set to be near the above eutectic point, and the reducing gas in the atmospheric gas is permitted to flow at a linear density of not smaller than 0.0376 cm/min but not larger than 0.564 cm/min.

Upon simultaneously satisfying the above two requirements, the paste material for the base metal electrodes is sufficiently reduced in the step of reducing the electrodes while preventing the ceramic material from being reduced. Accordingly, no eutectic material is formed, and properties of the dielectric ceramic layers are scarcely degraded.

Hence, it is possible to produce a laminated dielectric element featuring excellent properties such as Young's modulus, insulation resistance, etc.

Here, the reducing gas in the atmospheric gas is permitted to flow at a linear density which is not smaller than 0.0376 cm/min but is not larger than 0.564 cm/min.

When the linear density is not larger than 0.0376 cm/min, the paste material for the base metal electrodes is not sufficiently reduced in the step of reducing the electrodes, and the base metal oxide may remain. In this case, further, the base metal oxide that remains may form a eutectic material together with the metal oxide contained in the ceramic material, thereby degrading the piezo-electric characteristics of the dielectric ceramic layers.

When, on the other hand, the reducing gas is not smaller than 0.564 cm/min, not only the paste material for the base metal electrodes but also the metal oxide in the ceramic material are reduced in the step of reducing the electrodes, degrading the properties of the dielectric ceramic layers. Further, a metal that is formed as the metal oxide in the ceramic material is reduced may react with the base metal that is formed as the paste material for the base metal electrodes is reduced, to form a eutectic material of liquid phase which causes delamination.

Further, according to the fourth invention, even when the laminate has a relatively large size, the paste material for the base metal electrodes contained therein can be reduced to a sufficient degree, irrespective of the size thereof.

In other words, the paste material for the base metal electrodes in the laminate generally tends to be reduced less with an increase in the size of the laminate. In the case of a large laminate as described above, if it is attempted to fully reduce up to the paste material for the base metal electrodes in the laminate, the outer periphery of the laminate is easily reduced as it is exposed to the atmospheric gas having good fluidity, and the ceramic material in the outer peripheries may be reduced.

Further, in general, the amount of reaction of when the atmospheric gas passes near the laminate is affected by the flow rate of the atmospheric gas. In other words, when the flow rate of the atmospheric gas is large, the reaction in the system as a whole is delayed and when the flow rate of the atmospheric gas is small, the reaction in the system as a whole is quickened. In particular, when the atmospheric gas is fluidized in, for example, a heating furnace from the lower part of the heating furnace, there is established a troposphere as the flow rate of the atmospheric gas increases, creating a portion where the fluidity of the atmospheric gas becomes relatively low. The scale of the troposphere varies depending upon the flow rate of the atmospheric gas, and becomes relatively wide with an increase in the flow rate of the atmospheric gas.

In the fourth invention, the reducing gas is permitted flow at a linear density within the above-mentioned particular range. Therefore, even when the laminate has a relatively large size, it is allowed to reduce the paste material for the base metal electrodes to a sufficient degree while suppressing the reduction of the ceramic layers.

A fifth invention is concerned with a laminated dielectric element fabricated by a production method of any one of the above first to fourth inventions.

The laminated dielectric element of the fifth invention is produced by the production method of the first invention, second invention, third invention or fourth invention.

Therefore, the laminated dielectric element is almost free of delamination among the dielectric ceramic layers and the base metal electrode layers, and features a large Young's modulus, large insulating resistance and high quality.

BRIEF DESCRIPTION OF THE DRAWINGS

FIG. 5 is a view illustrating a laminate after the step of press-adhesion according to embodiment 1;

DESCRIPTION OF THE PREFERRED EMBODIMENTS

Figure 1:
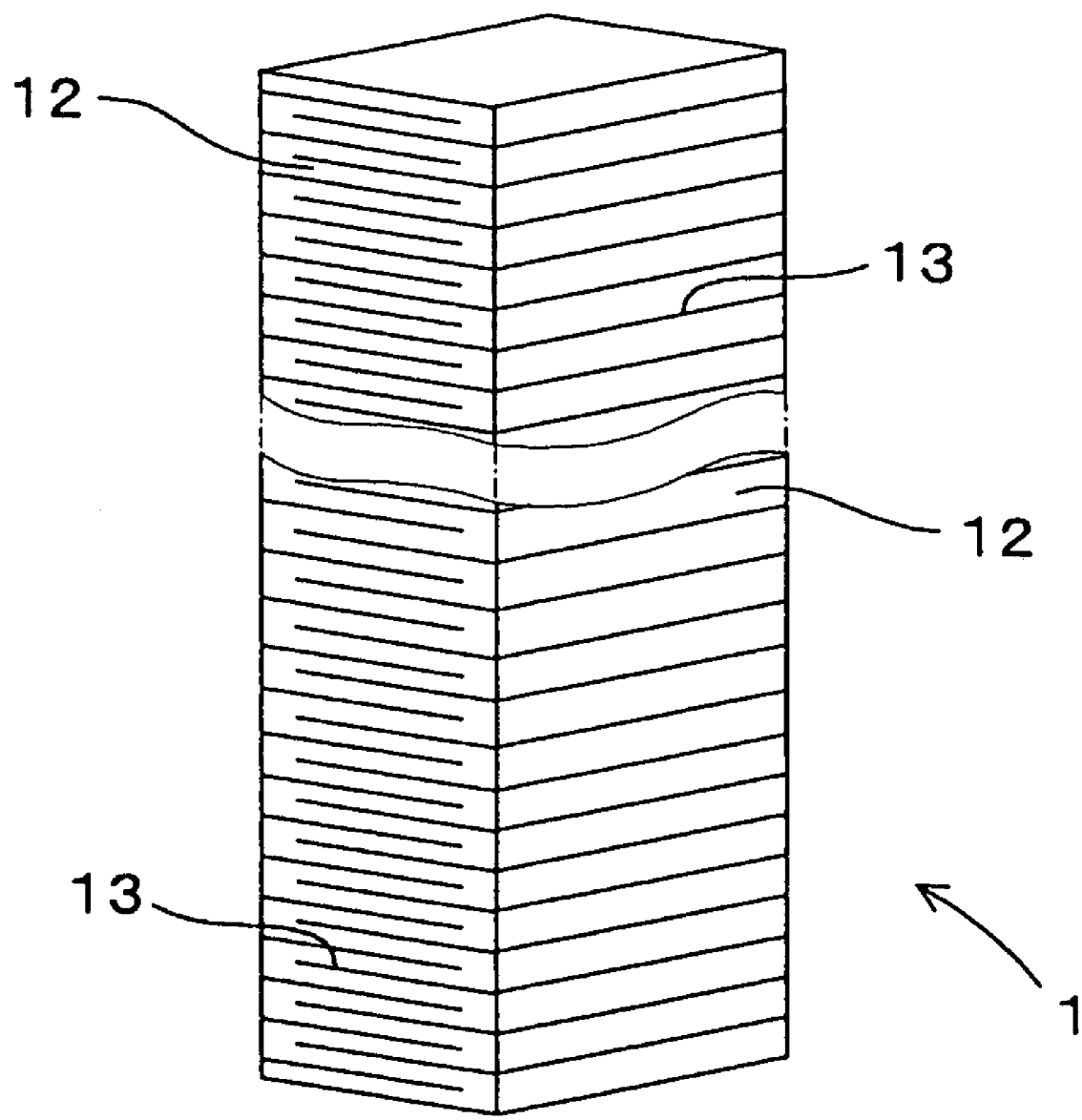
FIG. 1 is a perspective view illustrating an entire laminated dielectric element according to embodiment 1.

Described below is a preferred embodiment of the first invention.

In the first invention, the ceramic material is preferably a PZT material.

By utilizing excellent piezo-electric and dielectric properties possessed by the PZT material in this case, there can be produced a laminated dielectric element that can be utilized for laminated ceramic capacitors and laminated piezo-electric actuators of high performance.

In this connection, it is preferable that the atmospheric gas in the step of reducing the electrodes contain a reducing gas for reducing the paste material for the base metal electrodes and an oxidizing gas of oxygen and/or a gas that forms oxygen.

In the step of reducing the electrodes in this case, the reducing force of the reducing gas is suitably suppressed by the oxidizing gas, and the paste material for the base metal electrodes is reduced to a sufficient degree while preventing the metal oxide in the ceramic material from being reduced.

In general, ceramic materials are less reduced than the paste for the base metal electrodes. Therefore, in the step of reducing the electrodes, the reducing force of the reducing gas is controlled by using two gases, i.e., the reducing gas and the oxidizing gas as the atmospheric gas to preferentially reduce the paste material for the base metal electrodes.

Further, as the reducing gas, there can be used, for example, hydrogen, carbon monoxide, ammonia or hydrazine.

As the oxidizing gas, there can be used, for example, oxygen or water.

Also, it is preferable that the reducing gas be hydrogen, and the oxidizing gas be oxygen.

In this case, favorable effects can be obtained as both the reducing gas and the oxidizing gas are contained.

In the step of reducing the electrodes, it is preferable to begin the heating at a temperature-raising rate of not larger than 200° C./h, maintain a maximum holding temperature of 300° C. to 400° C. for 0.5 to 15 hours, then cool the furnace, take the laminate out of the heating furnace at a temperature of not higher than 90° C. while maintaining the oxygen partial pressure in the atmospheric gas to from $1 \times 10^{-23.9}$ to $1 \times 10^{-22}$ atm from the start of heating until the laminate is removed from the heating furnace.

In this case, oxygen serving as the oxidizing gas and hydrogen serving as the reducing gas become a parallel atmosphere expressed by the following formula (1) in the heating furnace,

$$H_2 + \tfrac{1}{2}O_2 \Leftrightarrow H_2O \qquad (1)$$

As a result, a stable oxygen partial pressure is realized. Therefore, in the step of reducing the electrodes, it is easy to decrease the mount of the base metal oxide remaining in the base metal electrode layers to be not larger than 20% by weight and to decrease the amount of lead released from the ceramic material so as to be not larger than 30 atomic % within 5000 Å from the surfaces of the base metal electrode layers.

Further, as will be understood from the above formula (1), water vapor is generated in the heating furnace. Therefore, when there is used a ceramic material containing lead like PZT material, lead existing in the form of an oxide in the ceramic material is suppressed from being turned into a metal excessively.

Here, cooling the furnace means holding the material that is treated in the furnace even after the heating is discontinued and letting the treated material to be cooled mildly and gradually by natural cooling.

When the oxygen partial pressure in the atmospheric gas exceeds $1 \times 10^{-22}$ atm, the oxygen partial pressure in the atmosphere is still high. Therefore, the base metal oxide may not be sufficiently reduced, and the unreduced base metal oxide may diffuse into the dielectric ceramic layers at the time of sintering.

When the oxygen partial pressure is smaller than $1 \times 10^{-23.9}$ atm, on the other hand, the base metal oxide in the paste material for the base metal electrodes may be reduced and, at the same time, the metal oxide including lead in the ceramic material, too, may be reduced, causing an excess of lead to be released. The released lead reacts with a base metal such as copper in the base metal electrode layers, and may dissolve the base metal electrode layers.

When the temperature-raising rate exceeds 200° C./h, the laminate may crack from thermal shock during the step of reducing the electrode.

When the maximum holding temperature is lower than 300° C., the paste material for the base metal electrodes is not reduced to a sufficient degree, and a large amount of base metal oxide may remain.

When, on the other hand, the maximum holding temperature exceeds 400° C., lead released from the ceramic material may react with the metal in the base metal electrode layers, causing the base metal electrode layers to dissolve.

When the maximum holding temperature is maintained for shorter than 0.5 hours, the paste material for the base metal electrodes may not be reduced to a sufficient degree.

When, on the other hand, the maximum holding temperature is maintained for longer than 15 hours, the ceramic material is reduced during the step of reducing the electrodes, spoiling the piezo-electric and dielectric properties possessed by the ceramic material.

Further, when the temperature at the time of removing the laminate is not lower than 90° C., the base metal electrode layers reduced in the step of reducing the electrodes may be oxidized with oxygen in the open air over the portions where it is exposed to the open air.

If the total amount of flow rates of gases constituting the atmospheric gas is regarded to be the total flow rate F (ml/min), then it is desirable that the oxygen flow rate $f_O$ (ml/min) and the hydrogen flow rate $f_H$ (ml/min) in the step of reducing the electrodes have a relationship of oxygen flow rate $f_O$=A×hydrogen flow rate $f_H$/total flow rate F−B (where $20 \leq A \leq 24$, $12 \leq B \leq 16$, $8 \leq A-B \leq 8.22$).

In this case, the ceramic material is prevented from being excessively reduced in the step of reducing the electrodes while the paste material for the base metal electrodes is reduced to a sufficient degree.

As a result, it is easy to decrease the amount of the base metal oxide remaining in the base metal electrode layers so as to be not larger than 20% by weight and to decrease the amount of lead released from the ceramic material to be not larger than 30 atomic % within 5000 Å from the surfaces of the base metal electrode layers in the step of reducing the electrodes.

When the oxygen flow rate $f_O$ becomes greater than the above range and oxygen becomes in excess, the paste material for the base metal electrodes is not sufficiently reduced and the base metal oxide remains. Therefore, during the step of sintering, the remaining base metal oxide may diffuse into the ceramic material. On the other hand, when the oxygen flow rate $f_O$ becomes smaller than the above range and oxygen becomes deficient, the metal oxide, too, may be reduced in the ceramic material.

In holding the maximum temperature in the step of reducing the electrode, if the molar flow rate of water formed by the reaction of hydrogen with oxygen is denoted by W and the molar flow rate of excess of hydrogen that is remaining by H, then it is desirable that the values of the two lie within the following ranges, $0.0012 \leq H \leq 0.0018$ (H: mols/min)

$0.0002 \leq W \leq 0.001$ (W: mols/min)

This minimizes a phenomenon wherein the laminate of a dielectric material containing lead oxide is reduced with hydrogen to precipitate lead while reducing the base metal oxide in the base metal electrode layers.

When H is smaller than 0.0012, an extended period of time is required to reduce the base metal oxide in the base metal electrode layers. When H is not smaller than 0.0018, the dielectric material is reduced with hydrogen to precipitate lead in increased amounts, which may react with the base metal electrode layers during the sintering, making it difficult to form the electrode layers.

In holding the maximum temperature in the step of reducing the electrodes, it is desirable that an integrated value h of the molar flow rate of hydrogen during the holding time lie within the following range, $29000 \leq h \leq 31000$ (h: mols/min)

In this case, the base metal electrode layers in the laminate of the dielectric material containing lead oxide do not react during the sintering, making it possible to minimize the amount of the base metal oxide in the base metal electrode layers and to minimize the amount of reaction of the base metal oxide with the dielectric material during the sintering. When h is smaller than 29000, this may cause a problem in that the unreduced base metal oxide remains in an amount of not smaller than 20% by weight in the base metal electrode layers. When h is not smaller than 31000, the amount of lead precipitated from the dielectric material as it is reduced with hydrogen exceeds 30 atomic % within 5000 Å from the surfaces of the base metal electrode layers, causing a reaction with the base metal electrode layer during the sintering and making it difficult to form the electrode layers.

In the step of printing the electrodes, it is desirable to apply the paste material for the base metal electrodes maintaining a thickness of 2 to 14 µm.

In this case, the paste material for the base metal electrodes can be sufficiently reduced in the step of reducing the electrodes to form the base metal electrode layers having a sufficient degree of electric conduction. Further, in conducting the step of reducing the electrodes, the paste material for the base metal electrodes is reduced to a sufficient degree almost without reducing the ceramic material.

When the paste material for the base metal electrodes has a thickness of smaller than 2 µm, the base metal electrode layers tend to break during the step of reducing the electrodes or during the step of sintering.

When, on the other hand, the paste material for the base metal electrodes has a thickness in excess of 14 µm, the paste material for the base metal electrodes is little reduced in the step of reducing the electrodes, and the remaining base metal oxide forms a liquid phase with the metal oxide in the ceramic material giving rise to the occurrence of delamination.

Also, the step of reducing the electrodes and the step of sintering can be simultaneously conducted by one heating.

In this case, the production process is simplified, making it easier to produce the laminated dielectric element.

Further, a step of removing organic components can be effected between the step of press-adhesion for fabricating the laminate and the step of reducing the electrodes for forming the base metal electrode layers by reducing the paste material for the base metal electrodes.

Next described is a preferred embodiment of the third or fourth invention.

In the third or fourth invention, the reducing gas may be, for example, hydrogen, carbon monoxide, ammonia or hydrazine.

Further, a gas for forming oxygen may be oxygen or water.

As above, the step of reducing the electrodes and the step of sintering can be simultaneously conducted by one heating, simplifying the process for producing the laminated dielectric element, thus making it easier to produce the laminated dielectric element.

In the third invention, the atmospheric gas contains the oxidizing gas and the reducing gas as described above for controlling the concentration of the reducing gas to lie within the above range. In the fourth invention, the linear density of the reducing gas is controlled to also lie within the above range.

Therefore, in the third and fourth inventions, even if the step of reducing the electrodes and the step of sintering are conducted simultaneously by one heating, the paste material for the base metal electrodes can be reduced almost without reducing the ceramic material. This is because the ceramic material is generally less subject to being reduced than the paste material for the base metal electrodes.

Also, it is desirable that the atmospheric gas further contain an inert gas and that the total amount of the reducing gas, oxidizing gas and inert gas not be smaller than 99% by volume of the atmospheric gas.

In this case, impurity gas other than the reducing gas, oxidizing gas and inert gas can be suppressed to be smaller than 1% by volume, thereby to prevent an undesired increase in the amounts of oxidizing gas and reducing gas contained in the impurity gas. In other words, when the impurity gas contains the oxidizing gas or the reducing gas, the total amount of the oxidizing gas and the reducing gas is prevented from increasing.

The inert gas may be, for example, Ar, Ne, $N_2$ and He.

Further, it is desired that the reducing gas be hydrogen, and the oxidizing gas be oxygen.

In this case, the above-mentioned effect of the invention can be obtained more conspicuously.

If a eutectic point of the base metal in the paste material for the base metal electrodes and of at least one metal in the ceramic green sheets is denoted by tm (° C.), it is desirable that the maximum holding temperature T (° C.) in the step of reducing the electrodes have a relationship tm−16<T<tm+14.

When the maximum holding temperature T (° C.) is not higher than tm−16 (° C.), the paste material for the base metal electrodes is not sufficiently reduced, and base metal electrode layers having a sufficient degree of electric conduction may not be formed.

When, on the other hand, the maximum holding temperature T (° C.) is not lower than tm +14 (° C.), the ceramic material is partly reduced during the step of reducing the electrodes, whereby the metal oxide released from the ceramic material reacts with the base metal formed as the paste material for the base metal electrodes is reduced, causing the base metal electrode layers to dissolve.

In addition, it is desirable that the ceramic material contain lead as an element component.

In this case, dielectric ceramic layers containing lead can be formed, making it possible to utilize the excellent dielectric properties of the dielectric ceramic layers containing lead.

As the dielectric ceramic layers, PZT material is preferably used.

In this case, by utilizing the excellent piezo-electric and dielectric properties possessed by the PZT material, a laminated dielectric element can be produced which can be utilized as laminated ceramic capacitors and laminated piezo-electric actuators of high performance.

In all of the first to fourth inventions described above, it is desirable that the base metal be copper.

In this case, the base metal electrode layers having excellent electric conduction can be formed inexpensively, to obtain the above-mentioned effect of the invention more conspicuously.

Also, in all of the first to fourth inventions, it is desirable to conduct the step of dewaxing for removing organic matter contained in the laminate after the step of press-adhesion.

This makes it possible to remove the organic material, to reduce the electrodes and to effect the reduction and sintering.

Embodiment 1.

Next described below with reference to FIGS. 1 to 9 is a method of producing a laminated dielectric element according to an embodiment of the first invention.

In this embodiment, as shown in FIG. 1, a laminated dielectric element 1 is produced by alternately laminating dielectric ceramic layers 12 and base metal electrode layers 13 of a base metal.

As will be described later, the method of production of this embodiment includes a step of printing the electrodes, a step of press-adhesion, a step of dewaxing, a step of reducing the electrodes and a step of sintering.

The step of printing the electrodes is one in which the paste material for the base metal electrodes containing a base metal oxide is applied onto the surfaces of at least one side of the ceramic green sheets obtained by forming, into the shape of a sheet, a ceramic material of a metal oxide containing lead oxide.

The step of press-adhesion is for fabricating a laminate by laminating and press-adhering the ceramic green sheets onto which the paste material for the base metal electrodes is applied.

The step of dewaxing is for dewaxing the laminate.

The step of reducing the electrodes is for forming base metal electrode layers by reducing the paste material for the base metal electrodes by heating the laminate in a heating furnace while flowing the atmospheric gas.

In the step of reducing the electrodes of this embodiment, the paste material for the base metal electrodes is so reduced that the amount of the base metal oxide remaining in the base metal electrode layers is not larger than 20% by weight and that the amount of metal released from the ceramic material within 5000 Å from the surfaces of the base metal electrode layers is not larger than 30 atomic %.

The method of production of the embodiment will be described below in detail.

First, the ceramic material was prepared in a manner as described below.

The lead oxide and the tungsten oxide were weighed in amounts of 83.5 mol % and 16.5 mol %, respectively, dry-mixed together, and were sintered at 500° C. for 2 hours to prepare an assistant oxide powder (chemical formula: $Pb_{0.835}W_{0.165}O_{1.33}$) in which the lead oxide and the tungsten oxide were partly reacted together. Next, the assistant oxide powder was milled by using a medium stirrer mill and was dried to enhance its reactivity.

On the other hand, metal oxides such as PbO, $SrCO_3$, $ZrO_2$, $TiO_2$, $Y_2O_3$, $Nb_2O_5$ and $Mn_2O_3$ were mixed together, dried, and were sintered at 890° C. for 7 hours to prepare a dielectric calcined powder.

Next, 5.5 liters of water was added to 4.7 kg of the dielectric calcined powder, and D134 (manufactured by Dai-ichi Kogyo Seiyaku Co.) was added thereto as a dispersant at a ratio of 5% by weight with respect to the dielectric calcined powder, and the mixture was stirred together for one hour to prepare a milling slurry of the dielectric calcined powder.

The milling slurry was milled by using the medium stirrer mill for 8 hours, and was further dried by using a spray drier at 220° C. to obtain a milled powder of the dielectric calcined powder. Since the dispersant was remaining in the milled powder, the milled powder was further heat-treated at 650° C. for 5 hours to dewax the dispersant and to obtain the dielectric calcined powder.

Next, to 700 g of the dielectric calcined powder was added 3.5 g of the assistant oxide prepared in advance as described above to thereby prepare a starting powder. To the starting powder were further added, as a solvent, ethanol, 2-butanol and isoamyl acetate in a total amount of 48% by weight, as well as sorbitan triolate as a dispersant in an amount of 0.6% by weight, BBP (benzylbutyl phthalate, manufactured by Wako Junyaku Kogyo Co.) as a plasticizer in an amount of 5% by weight and PVB (polyvinyl butyral, manufactured by Denki Kagaku Kogyo Co.) as a binder in an amount of 7.5% by weight. The mixture was stirred in a ball mill for 72 hours to obtain a slurry of the dielectric ceramic material.

Thereafter, the slurry of the above ceramic material was molded into a sheet by a doctor blade method. The sheet was then dried at 80° C. and cut by using a sheet cutter into a size of 100 mm×150 mm to obtain a ceramic green sheet.

Next, the step of printing the electrodes and the step of press-adhesion will be described with reference to FIGS. 2 and 3.

First, a paste material for the base metal electrodes was prepared as described below.

In preparing the paste material for the base metal electrodes, first, solid components were prepared for forming the paste material for the base metal electrodes. The solid components had a composition of 28% by weight of a CuO powder (having a specific surface area of 10 to 15 m$^2$/g, manufactured by Kojundo Kagaku Co.) as the base metal oxide, 56.6% by weight of Cu powder (having an average particle size of not larger than 0.5 μm, manufactured by Mitsubishi Material Co.) and 15% by weight of a co-powder having the same composition as the above-mentioned dielectric calcined powder and granulated to have a particle size of not larger than 20 μm.

Next, to 78% by weight of the solid components were added 5.5 to 15% by weight of ethyl cellulose as a binder, 0.7 to 2% by weight of a higher fatty acid as a dispersant, and a remainder of butyl carbitol or terpineol which is a solvent such that the total amount thereof was 22% by weight. These components were mixed together by using a centrifugal stirrer/defoaming device to prepare a paste material for the base metal electrodes.

Figure 2:
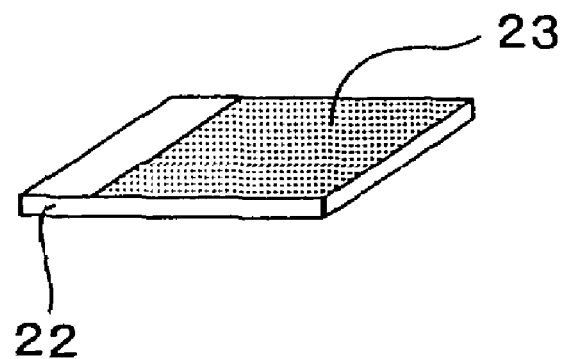
FIG. 2 is a view illustrating a state where a paste material for the base metal electrodes is printed onto a ceramic green sheet according to embodiment 1.

Referring next to FIG. 2, the paste material 23 for the base metal electrodes was applied onto a plurality of the ceramic green sheets 22. At that time, the paste material 23 for the base metal electrodes was applied onto the surfaces on one side of the ceramic green sheets 22 by a screen-printing method. The thickness of the printing was 6 μm. FIG. 2 illustrates a green sheet after the printing.

Figure 3:
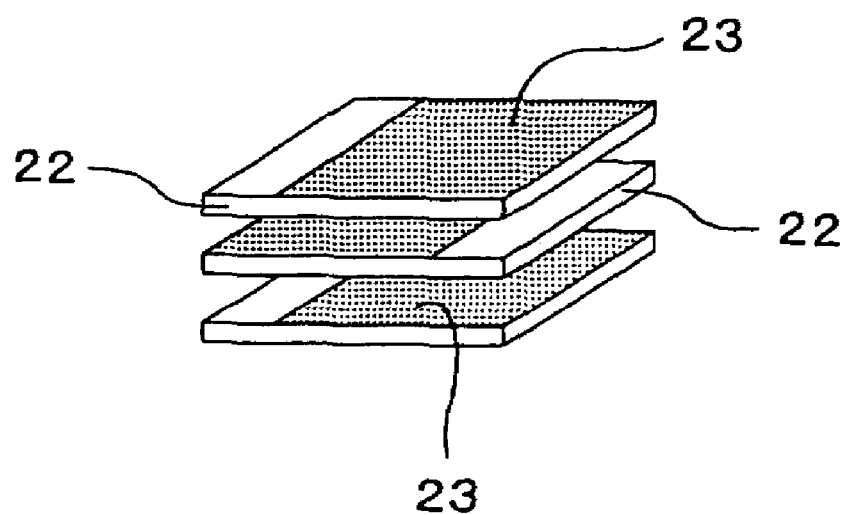
FIG. 3 is a view illustrating a state where the ceramic green sheets according to embodiment 1 are laminated in the step of press-adhesion.
Figure 4:
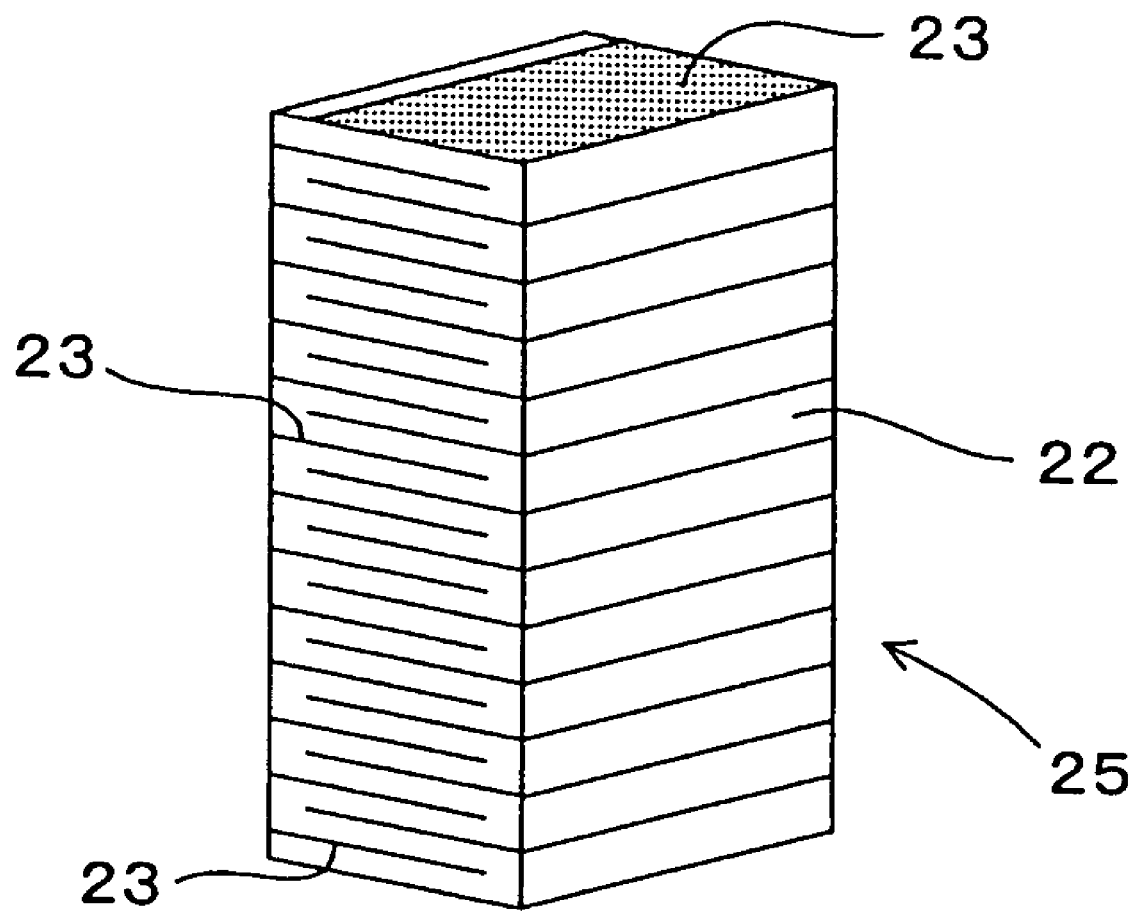
FIG. 4 is a view illustrating a unit of the ceramic green sheets according to embodiment 1.

Referring next to FIG. 3, there were laminated ceramic green sheets 22 on which the paste material 23 for the base metal electrodes has been printed. Here, the paste material 23 for the base metal electrodes was permitted to reach the right and left side surfaces alternately. The ceramic green sheets 22 were thus successively laminated. Referring to FIG. 4, a total of 26 pieces of ceramic green sheets 22 were laminated to obtain a unit 25. By similarly laminating the ceramic green sheets, there were prepared ten units 25 each obtained by laminating 26 pieces of ceramic green sheets 22.

Among the ten units 25, one unit was obtained by preparing a piece of ceramic green sheet on which the paste material for the base metal electrodes had not been printed, and by laminating the ceramic green sheet without the paste material as the uppermost layer of the laminate of the ceramic green sheets 22.

The above ten units 25 were secured to the press-adhering jigs, respectively, and were thermally press-adhered at 110° C. for 1 minute under 16 MPa. The thermally press-adhered units 25 were cut by a sheet cutter into a size of 9 mm deep and 9.5 mm wide and were flattened at normal temperature by the application of pressure of 7.8 MPa in the direction of lamination.

Referring next to FIG. 5, the above ten units 25 were stacked and were thermally press-adhered by using a laminating device at 125° C. for 10 minutes under a pressure of 1.6 kN (16.5 MPa) to fabricate a laminate 27 having a size of 10.2 mm deep, 9.5 mm wide and 20 mm high. The ten units were so stacked that the paste material 23 for the base metal electrodes was not exposed on the uppermost end surface and on the lowermost end surface.

Figure 6:
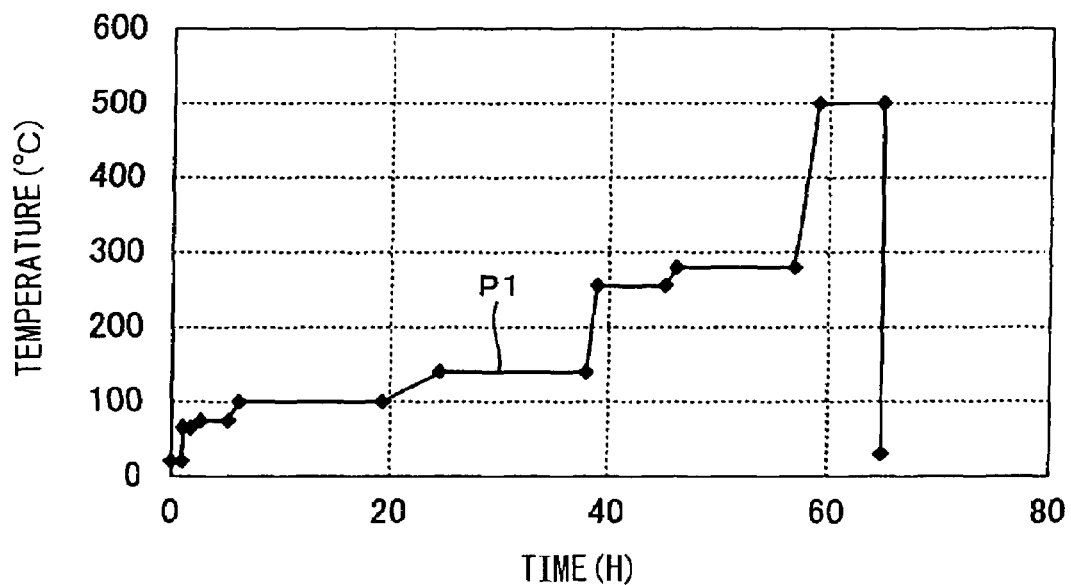
FIG. 6 is a diagram illustrating the conditions of setting temperatures in the step of dewaxing according to embodiment 1.

Then, the laminate 27 was introduced into a gas-circulating dewaxing furnace, and was heated at temperatures that were set as illustrated in FIG. 6 to effect the dewaxing. FIG. 6 illustrates a temperature pattern P1 wherein the abscissa represents the passage of time (h) and the ordinate represents the temperature (° C.) near the laminate.

Next, the paste material 23 for the base metal electrodes of the laminate 27 was reduced (step of reducing the electrode).

Figure 7:
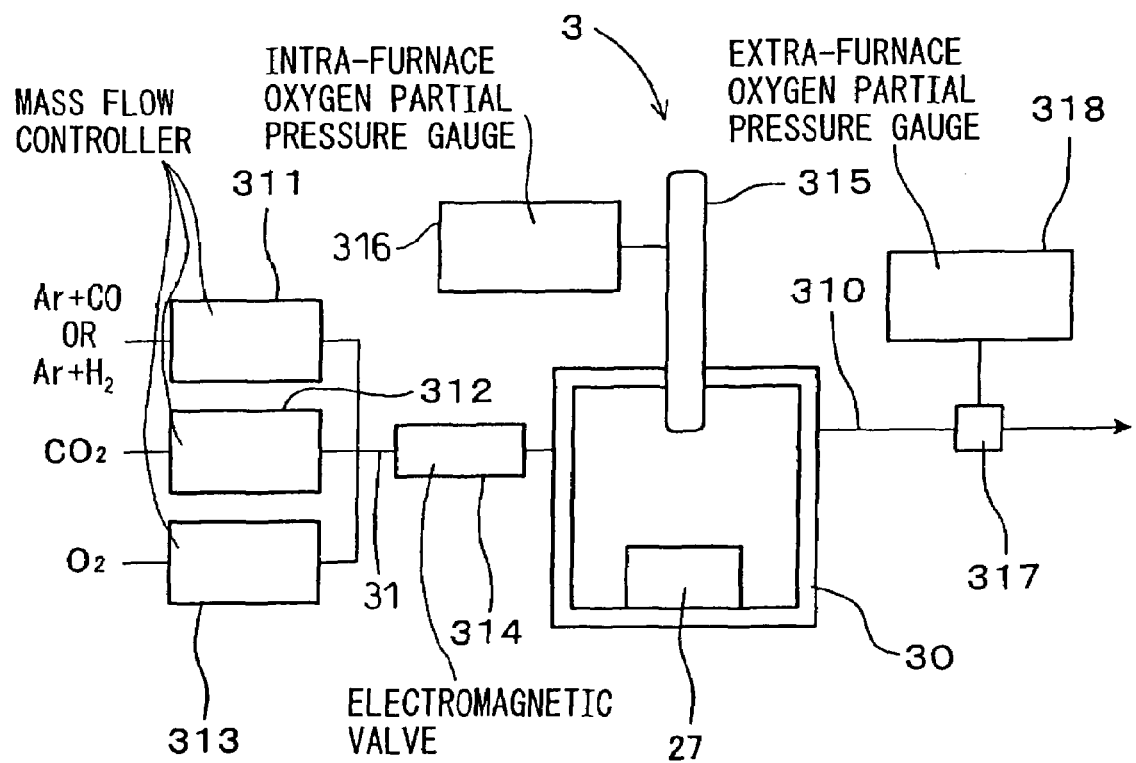
FIG. 7 is a diagram illustrating the constitution of the heating furnace according to embodiment 1.

The step of reducing the electrodes was carried out in a heating furnace 3 illustrated in FIG. 7.

Referring to FIG. 7, the heating furnace 3 includes a furnace chamber 30 for heating the laminate 27, an intra-furnace oxygen partial pressure sensor 315 inserted in the furnace chamber 30, and an intra-furnace oxygen partial pressure gauge 316 for obtaining a detected value from the sensor 315. The heating furnace 3 further includes mass flow controllers 311, 312, 313 for introducing Ar—H$_2$ (or Ar—CO), CO$_2$ and O$_2$ into the furnace chamber 30, and a flow path 31 equipped with an electromagnetic valve 314 for suitably changing the flow path from the mass flow controllers 31, 312, 313 over to the furnace chamber 30.

In an exhaust gauge 310 from the furnace chamber 30 to the exterior, there are arranged an extra-furnace oxygen partial pressure sensor 317 and an extra-furnace oxygen partial pressure gauge 318 for obtaining an output value from the sensor 317.

The oxygen partial pressure in the furnace chamber 30 is controlled on the basis of the extra-furnace oxygen partial pressure sensor 317, partial pressure gauge 318, intra-furnace oxygen partial pressure sensor 315 and partial pressure gauge 316.

The extra-furnace oxygen partial pressure sensor 317 is a zirconia O$_2$ sensor which is heated by a heater incorporated therein at not lower than 600° C. at all times, and measures the oxygen partial pressure in the gas introduced into the extra-furnace oxygen partial pressure sensor 317 over an entire temperature range.

The intra-furnace oxygen partial pressure sensor 315 also is a zirconia O$_2$ sensor which, however, does not have a heater incorporated therein, but begins measuring the oxygen partial pressure in the furnace chamber 30 when the temperature in the furnace chamber of the sintering furnace 3 is elevated to about 400 to 500° C. or higher. Therefore, in the sintering furnace, the extra-furnace oxygen partial pressure sensor 317 is used when the temperature in the furnace lies outside the temperature range that can be measured by the intra-furnace oxygen partial pressure sensor 315.

Figure 8:
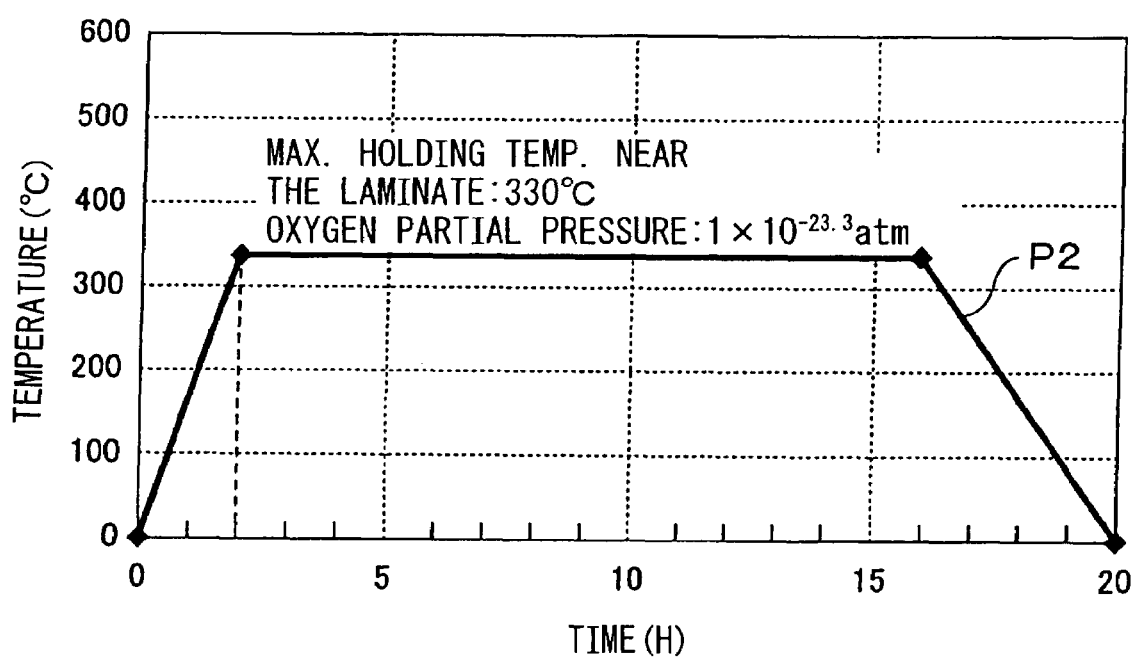
FIG. 8 is a diagram illustrating a manner of controlling the temperature in the step of reducing the electrodes according to embodiment 1.

In the step of reducing the electrodes, first, the laminate 27 is placed in the furnace chamber 30, heated while elevating the temperature at a rate of 180° C./h (155° C./h near the laminate), and a maximum temperature is held at 330° C. near the laminate for 14 hours. Then, the temperature is lowered at a rate at which the furnace is cooled. The laminate is taken out when the temperature in the furnace chamber 30 is cooled down to 90° C. The manner of temperature control in this case is illustrated in FIG. 8. FIG. 8 illustrates a temperature pattern P2, wherein the abscissa represents the time from the start of heating and the ordinate represents the temperature near the laminate.

At the time of heating, there were introduced, as the atmospheric gas, Ar—$H_2$ which was a mixed gas of Ar and hydrogen, and $O_2$ for adjusting the oxygen partial pressure. The concentration of hydrogen gas in the Ar—$H_2$ gas was 0.99%. The flow rate of Ar—$H_2$ at the time of introducing the atmospheric gas was 5000 ml/min, and the flow rate of $O_2$ was 8.0 ml/min. At that time, the value of the extra-furnace oxygen partial pressure gauge 318 was maintained to be nearly $1 \times 10^{-23.7}$ atm.

The flow rate of oxygen was determined by applying the formula, oxygen flow rate $f_o = A \times$ hydrogen flow rate $f_H$/total flow rate F−B (where $20 \leq A \leq 24$, $12 \leq B \leq 16$). In this embodiment, the oxygen flow rate $f_o$ was determined while assuming the values A and B in the above formula to be A=22.22 and B=14.

Thus, CuO contained in the in the paste material for the base metal electrodes was reduced to Cu to form the base metal electrode layers.

Next, the laminate was sintered (step of sintering) by using the same heating furnace 3 as for the above-mentioned step of reducing the electrodes. The step of sintering will now be described with reference to FIG. 7.

In the step of sintering, the laminate 27 after the step of reducing the electrodes was placed in the furnace chamber 30 of the heating furnace 3, the heating was started while elevating the temperature at a rate of 300° C./h, and the laminate was heated at a maximum temperature held at 970° C. for 2 hours. As the atmospheric gas, there were introduced $CO_2$ (base gas), Ar—CO (CO concentration was 10% by volume) comprising Ar as an inert gas and CO as a reducing gas and $O_2$ (oxidizing gas) for adjusting the oxygen partial pressure into the furnace chamber 30, at predetermined flow rates, respectively. The flow rates of $CO_2$ and Ar—CO at that time were 5000 ml/min and 150 ml/min, respectively, and the flow rate of $O_2$ was in a range of 2 to 8 ml/min.

The oxygen partial pressure was controlled from room temperature up to nearly 600° C. on the basis of the extra-furnace oxygen partial pressure sensor 317 and the partial pressure gauge 318, so that a value indicated by the extra-furnace oxygen partial pressure sensor 317 was $10^{-12.9}$ to $10^{-16.0}$ atm.

As the temperature exceeded 600° C., the operation for controlling the oxygen partial pressure was changed over to the one based on the intra-furnace oxygen partial pressure sensor 315 and the partial pressure gauge 316. A value indicated by the intra-furnace oxygen partial pressure sensor 315 at the time when the operation was changed over was $10^{-10}$ to $10^{-14}$ atm. The atmosphere was controlled by linearly elevating the oxygen partial pressure from just after the change over of operation through up to the maximum holding temperature, and then maintaining the oxygen partial pressure in a range of $10^{-6.0}$ to $10^{-8.0}$ atm at the maximum holding temperature.

Figure 9:
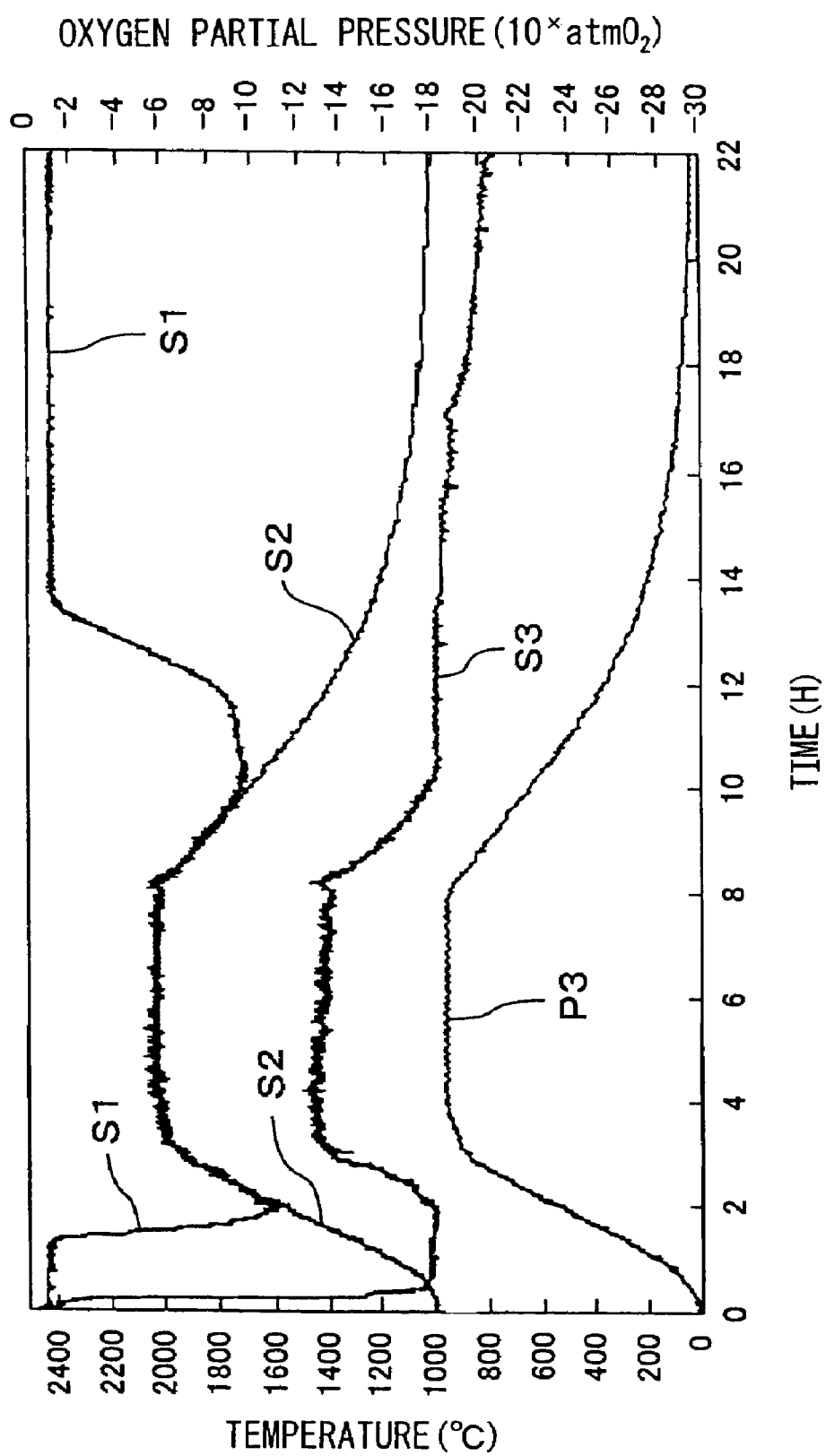
FIG. 9 is a diagram illustrating a manner of controlling the temperature and the oxygen partial pressure in the step of sintering according to embodiment 1.

The manner of control is illustrated in FIG. 9 as a relationship among the time, temperature and oxygen partial pressure (values indicated by the intra-furnace oxygen partial pressure sensor and by the extra-furnace oxygen partial pressure sensor). FIG. 9 illustrates the intra-furnace oxygen partial pressure S1, intra-furnace target oxygen partial pressure S2, extra-furnace oxygen partial pressure S3 and temperature pattern P3, wherein the abscissa represents the time, the left ordinate represents the temperature and the right ordinate represents the value x of when the oxygen partial pressure is expressed by $10^x$ atm. Here, $1 \text{o} x$ atm is equal to $1.013 \times 10^5 \times 10^x$ Pa.

By sintering the laminate 27 as described above, there was obtained the laminated dielectric element 1 as shown in FIG. 1. This element was labeled as sample E1.

As illustrated in FIG. 1, the laminated dielectric element 1 of this embodiment was obtained by alternately laminating the dielectric ceramic layers 12 and the base metal electrode layers 13 of a base metal. The dielectric ceramic layers 12 were laminated in a number of 240 layers in the laminated dielectric element 1, and each layer had a thickness of 90 μm.

Further, in this embodiment, laminated dielectric elements were fabricated by changing the conditions for controlling the atmospheric gas in the step of reducing the electrodes from those of when the sample E1 was fabricated. These elements were labeled as samples E2 to E4 and samples C1 to C3.

In preparing the samples E1 to E4 and the samples C1 to C3, the samples after the step of reducing the electrodes were prepared separately and were labeled as samples E1a to E2a and samples C1a to C3a.

The conditions for controlling the atmospheric gas for the samples were as shown in Table 1 appearing later. Among the conditions for controlling the atmospheric gas, the oxygen flow rate for the samples E1 to E4 was determined in compliance with the oxygen flow rate $f_o = A \times$ hydrogen flow rate $f_H$/total flow rate F−B (where $20 \leq A \leq 24$, $12 \leq B \leq 16$). Here, the values A and B were A=22.22 and B=14 for the sample E2, A=20.22 and B=12 for the sample E3, and A=24.22 and B=16 for the sample E4.

The samples C1 to C3 were fabricated while flowing oxygen at flow rates outside the range of the above-mentioned formula.

Concerning the samples E1a to E4a and samples C1a to C3a obtained just after the step of reducing the electrodes, next, the amounts of Cu oxide remaining in the base metal electrode layers were found by a thin-film X-ray diffraction method. Further, the concentrations of lead released from the ceramic green sheets into the base metal electrode layers were measured.

First, the sample E1a was so disassembled as to be peeled off on the interface between the base metal electrode layer and the ceramic green sheet, and one layer of the base metal electrode was transferred onto a double-sided tape. The thus-transferred base metal electrode layer was measured by using an X-ray diffraction apparatus (XRD 6100 manufactured by Shimazu Seisakusho Co.) using the thin-film X-ray diffraction method.

Figure 16:
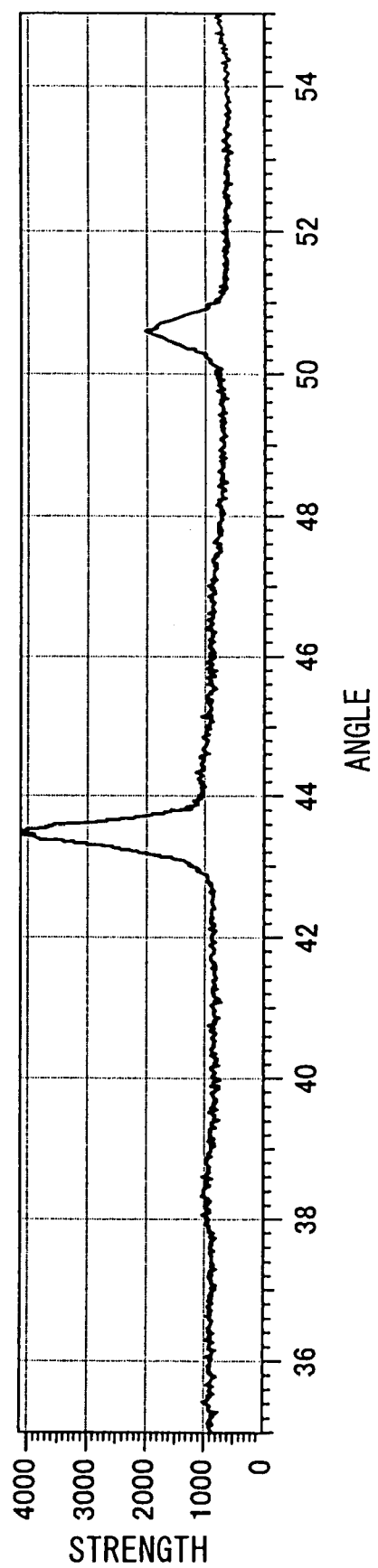
FIG. 16 is a diagram illustrating an X-ray diffraction spectrum of components contained in the base metal electrode layers according to embodiment 1.
Figure 17:
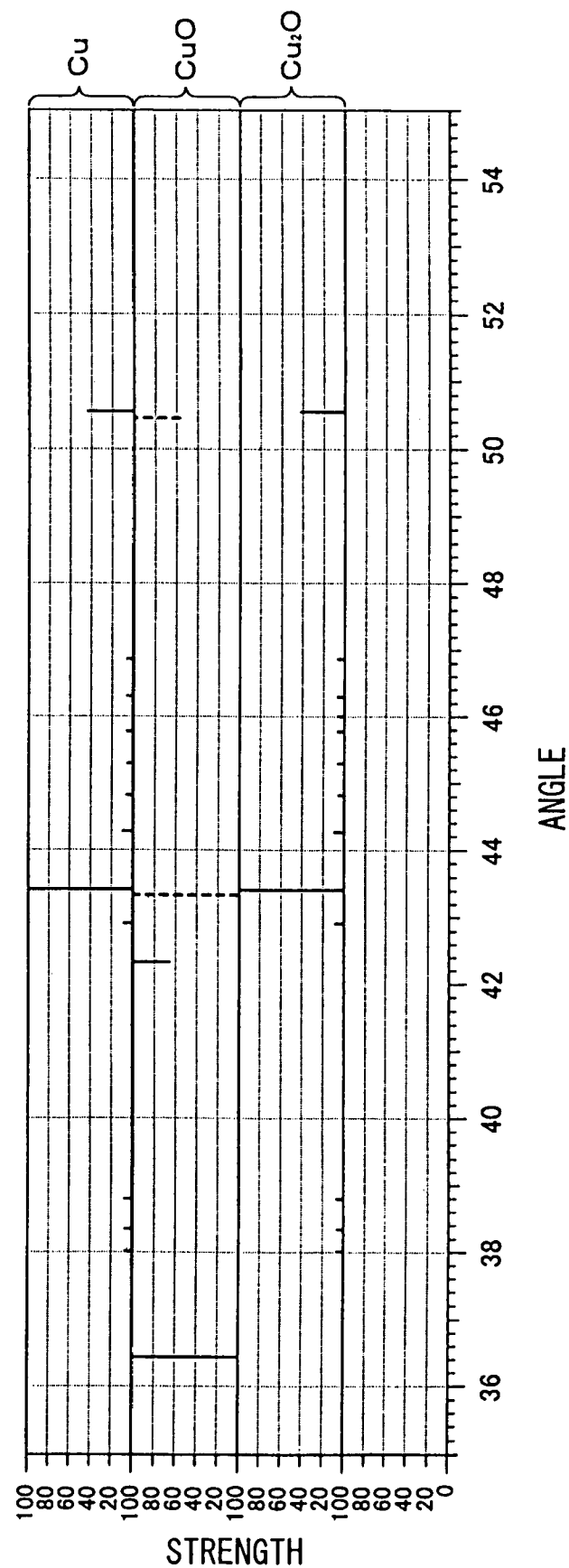
FIG. 17 is a diagram illustrating peak positions and peak intensities of the components in FIG. 16 according to embodiment 1.

As a result, as shown in FIGS. 16 and 17, there were obtained X-ray diffraction spectra of components contained in the base metal electrode layers. From these spectra, it was found that the components contained in the base metal electrode layers were dielectric ceramic material which is a co-powder, Cu which is an electrically conducting component reduced in the step of reducing the electrodes, $Cu_2O$ which is an unreduced copper oxide and, rarely, CuO.

From these results, the remaining amount of Cu oxide was found from a corundum ratio, and the amount of reducing copper (% by weight) was found from the remaining amount of Cu oxide.

FIG. 16 is a diagram illustrating spectra, and FIG. 17 is a diagram illustrating peak positions in FIG. 16.

As determining means in this case, there can be exemplified easy determining means based on the corundum ratio as described above and determining means for inspecting the concentration of an inspection sample featuring excellent determining precision. In this embodiment, the copper concentration in the base metal electrode layers is at least as high as 50% by weight or more, and the precision of determination is not a matter of importance. Therefore, the determination based on the corundum ratio was employed as described above.

Figure 18:
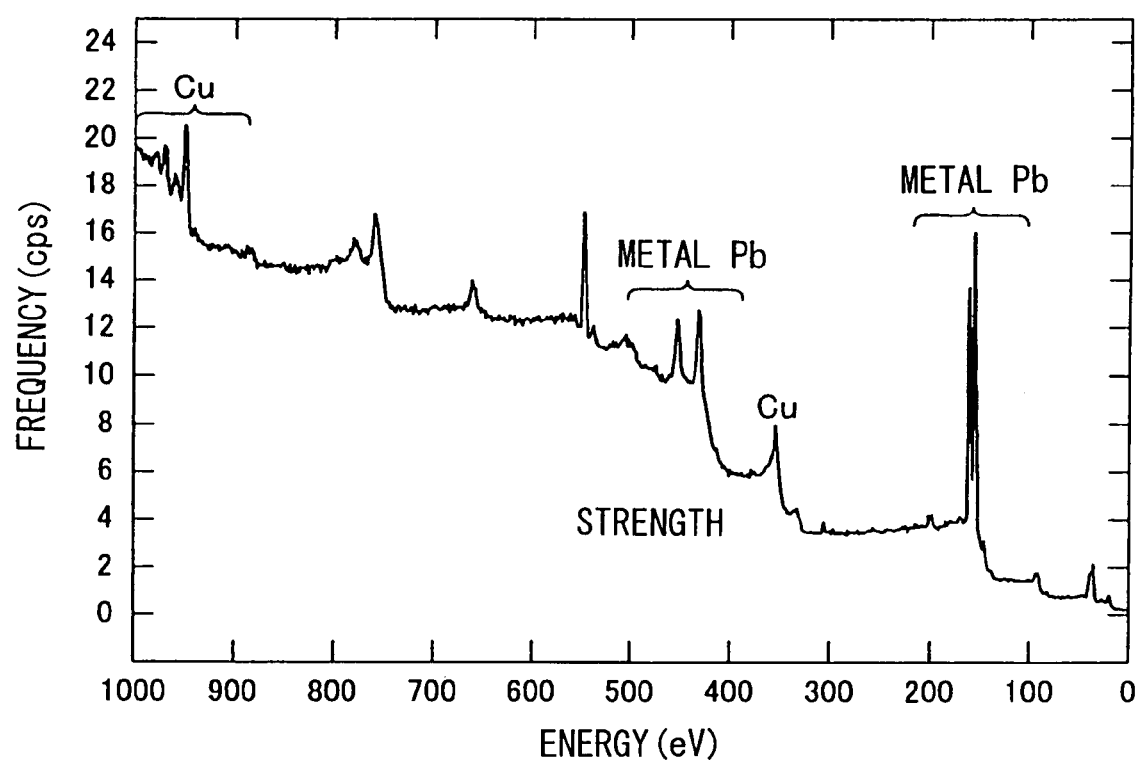
FIG. 18 is a diagram illustrating the results of measurement in the X-ray photoelectron spectroscopic analysis according to embodiment 1.

Next, the sample E1a used for the X-ray diffraction was machined into a cube measuring 8 mm to prepare a sample for the X-ray photoelectron spectroscopic analysis (XPS: manufactured by VG Systems Japan Co., X-ray beam diameter of 2 mm). The atomic ratio of Cu and Pb was measured within 5000 μÅ from the exposed surface of the base metal electrode layer. The results of the X-ray photoelectron spectroscopic analysis were as shown in a diagram in FIG. 18.

Figure 19:
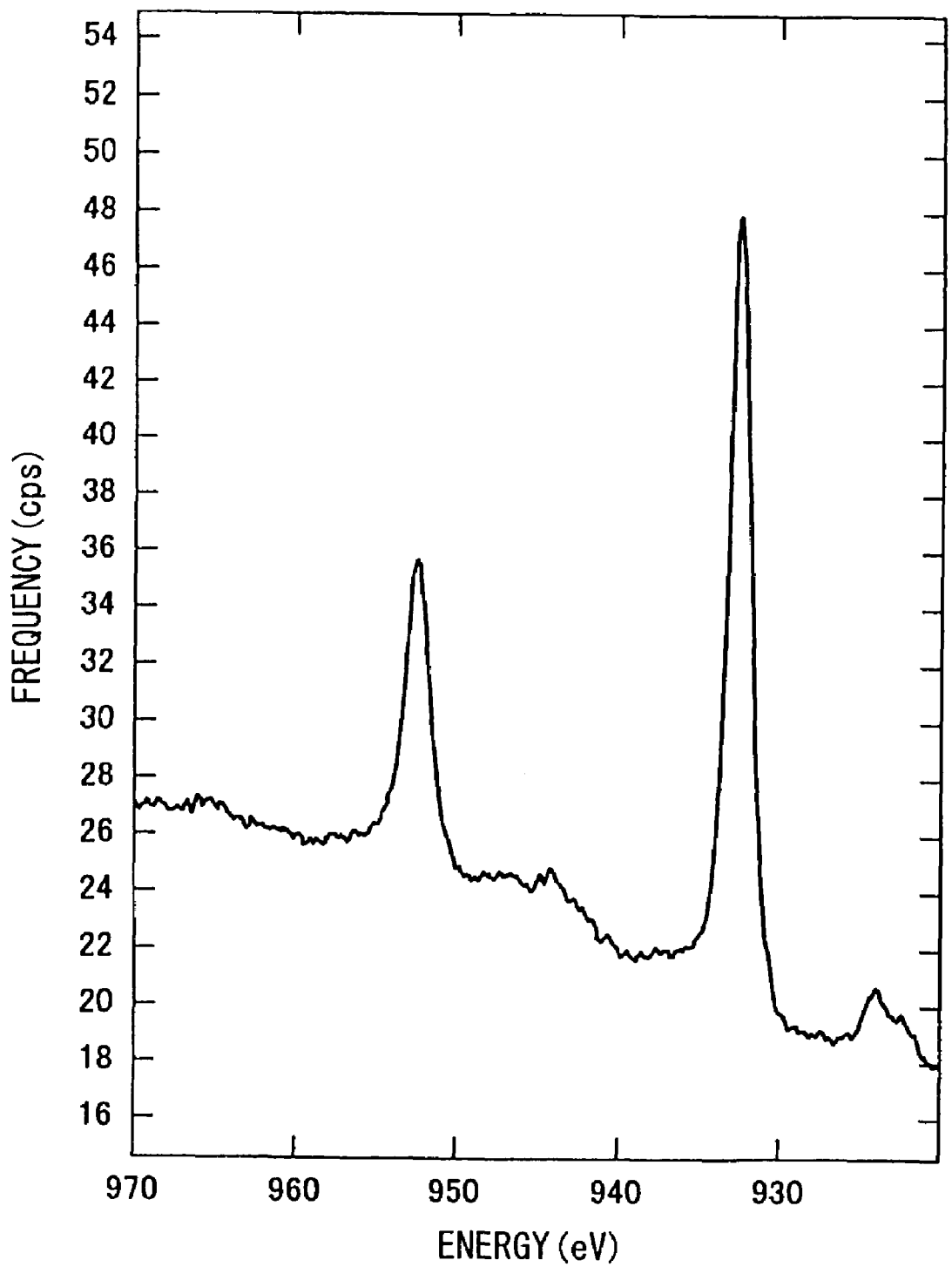
FIG. 19 is a diagram illustrating, on an enlarged scale, a range of 970 to 920 in FIG. 18 according to embodiment 1.
Figure 20:
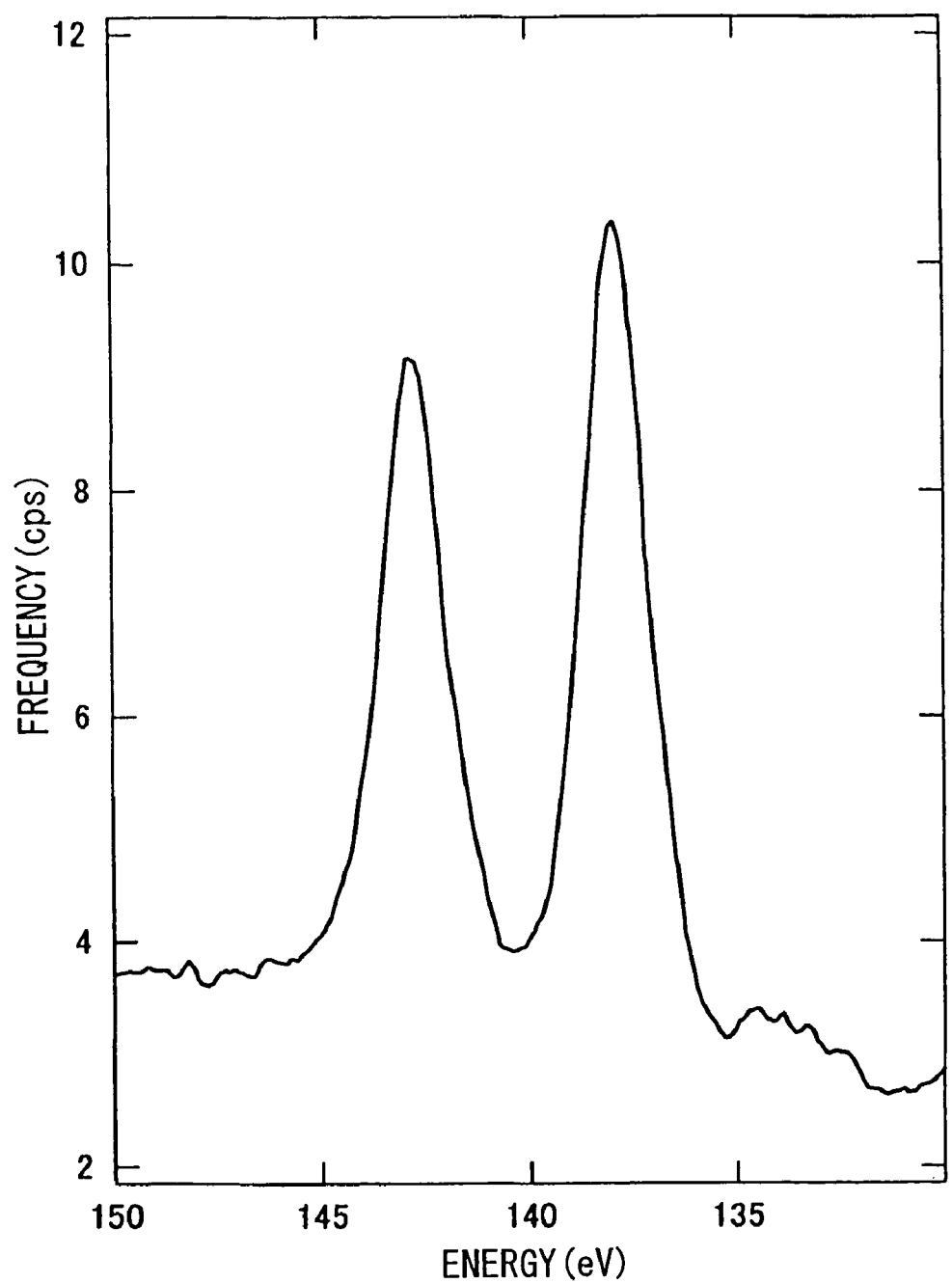
FIG. 20 is a diagram illustrating, on an enlarged scale, a range of 150 to 130 in FIG. 18 according to embodiment 1.

FIG. 19 is a diagram illustrating a range of 970 to 920 on an enlarged scale, and FIG. 20 is a diagram illustrating a range of 150 to 130 on an enlarged scale.

From the detected results, there was found a ratio of the Pb detection peak area to the Cu detection peak area, and the generated amount of Pb (atomic %) was calculated. Since the base metal electrode layers are in contact with the ceramic green sheets, interference may occur in the analysis results. To avoid this, the surfaces of the base metal electrode layers were etched in advance with Ar for about 30 seconds.

Then, the same operation as above was executed for the samples E2a to E4a and C1a to C3a.

Figure 10:
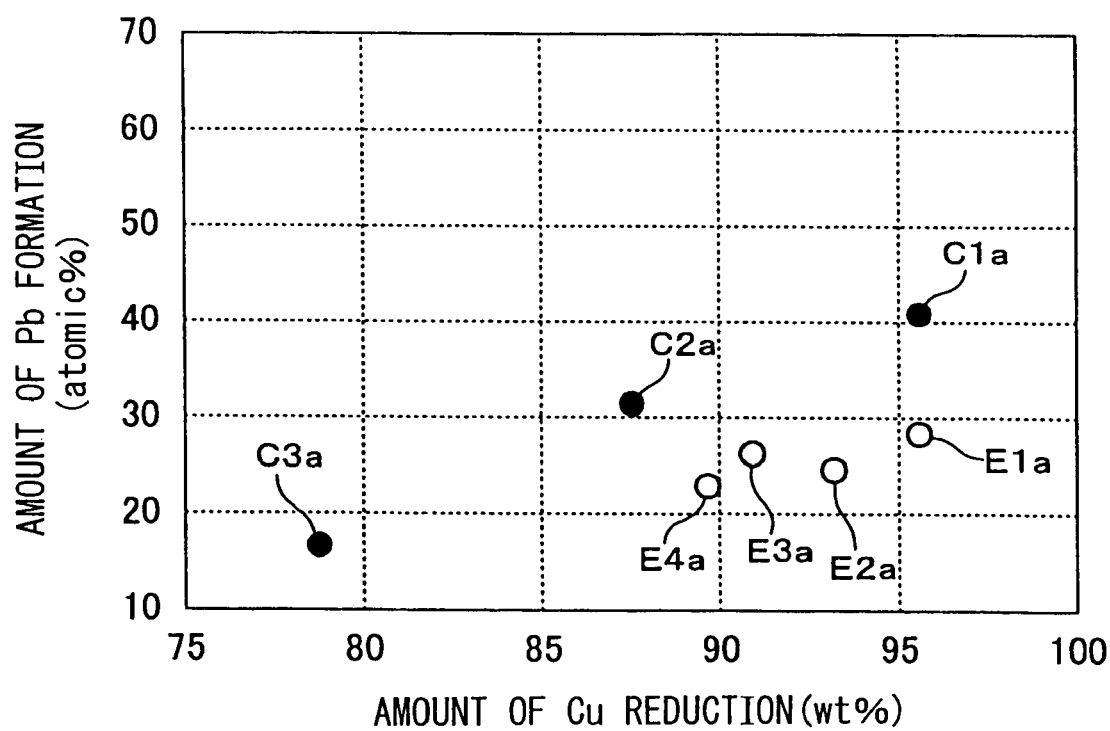
FIG. 10 is a diagram illustrating the results of Cu-generating amounts and the copper-reducing amounts of samples Ea1 to Ea4 and samples Ca1 to Ca4 according to embodiment 1.

The amounts of Pb formation and the amounts of reducing copper of the samples E1a to E4a and C1a to C3a were plotted as shown in FIG. 10.

In FIG. 10, the abscissa represents the amount of Cu reduction (% by weight) and the ordinate represents the amount of Pb formation (atomic %).

In all of the samples E1a to E4a, as will be obvious from FIG. 10, it was found that CuO was reduced by not less than 85% by weight, and hence the paste material for the base metal electrodes was fully reduced. Further, the amounts of forming lead released from the ceramic green sheets were all smaller than 30 atomic %.

On the other hand, in the samples C1a and C2a, the paste material for the base metal electrodes was fully reduced, and also the ceramic green sheets were reduced, while lead was released in excess of 30 atomic %.

In the sample C3a, formation of lead was suppressed to a low level. However, the paste for the base metal electrodes was not sufficiently reduced, and the amount of Cu reduction was not larger than 80% by weight.

Next, among the samples E1 to E4 and the samples C1 to C3 obtained by sintering the samples E1a to E4a and the samples C1a to C3a through the step of sintering, the copper distributions in the samples E1 and C3 were examined by using an EPMA (electron probe macroanalyzer) which is a kind of X-ray microanalyzer.

Figure 11:
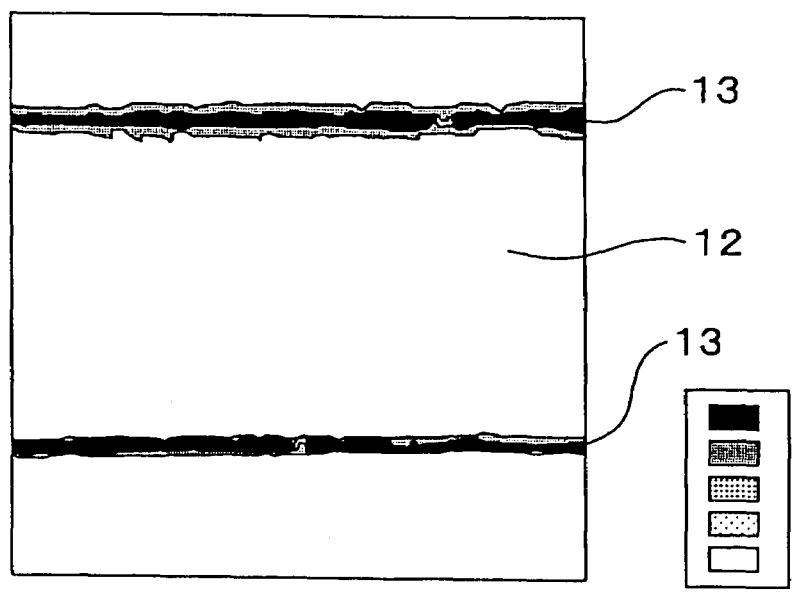
FIG. 11 is a view illustrating the manner of Cu distribution in the sample E1 according to embodiment 1.
Figure 12:
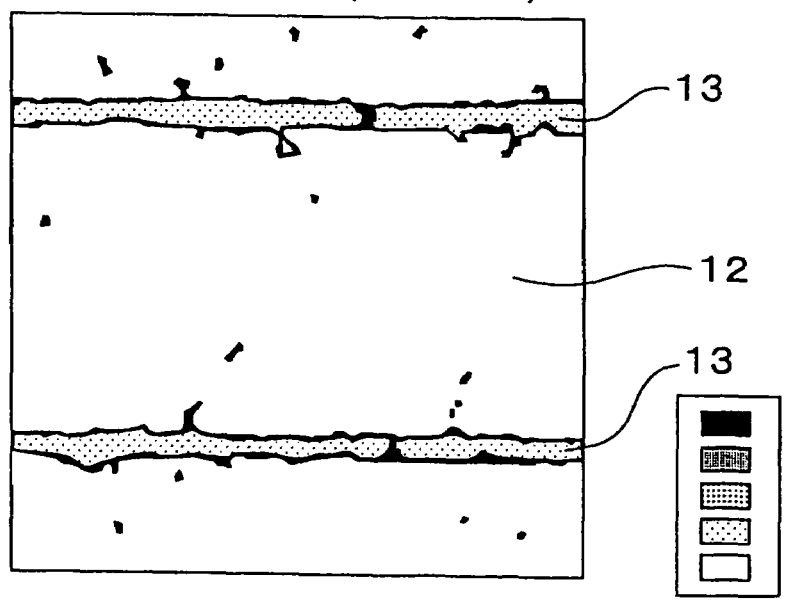
FIG. 12 is a view illustrating the manner of Cu distribution in the sample C3 according to embodiment 1.

The results were as shown in FIG. 11 (sample E1) and FIG. 12 (sample C3). In these drawings or in FIGS. 15, 23 and 24 that will be described later, the distributions of copper or oxygen atoms were expressed for the amounts of distribution by using five kinds of hatched patterns. The kinds of the hatched patterns are shown in a square at the right lower portion in each drawing, the uppermost hatched pattern representing the greatest amount of distribution, and the amount of distribution decreasing toward the lower side.

In the sample E1, as will be learned from FIGS. 11 and 12, copper is distributed in the base metal electrode layer 13 only, whereas in the sample C3, copper distribution is diffused into the dielectric ceramic layer 12 also.

Figure 13:
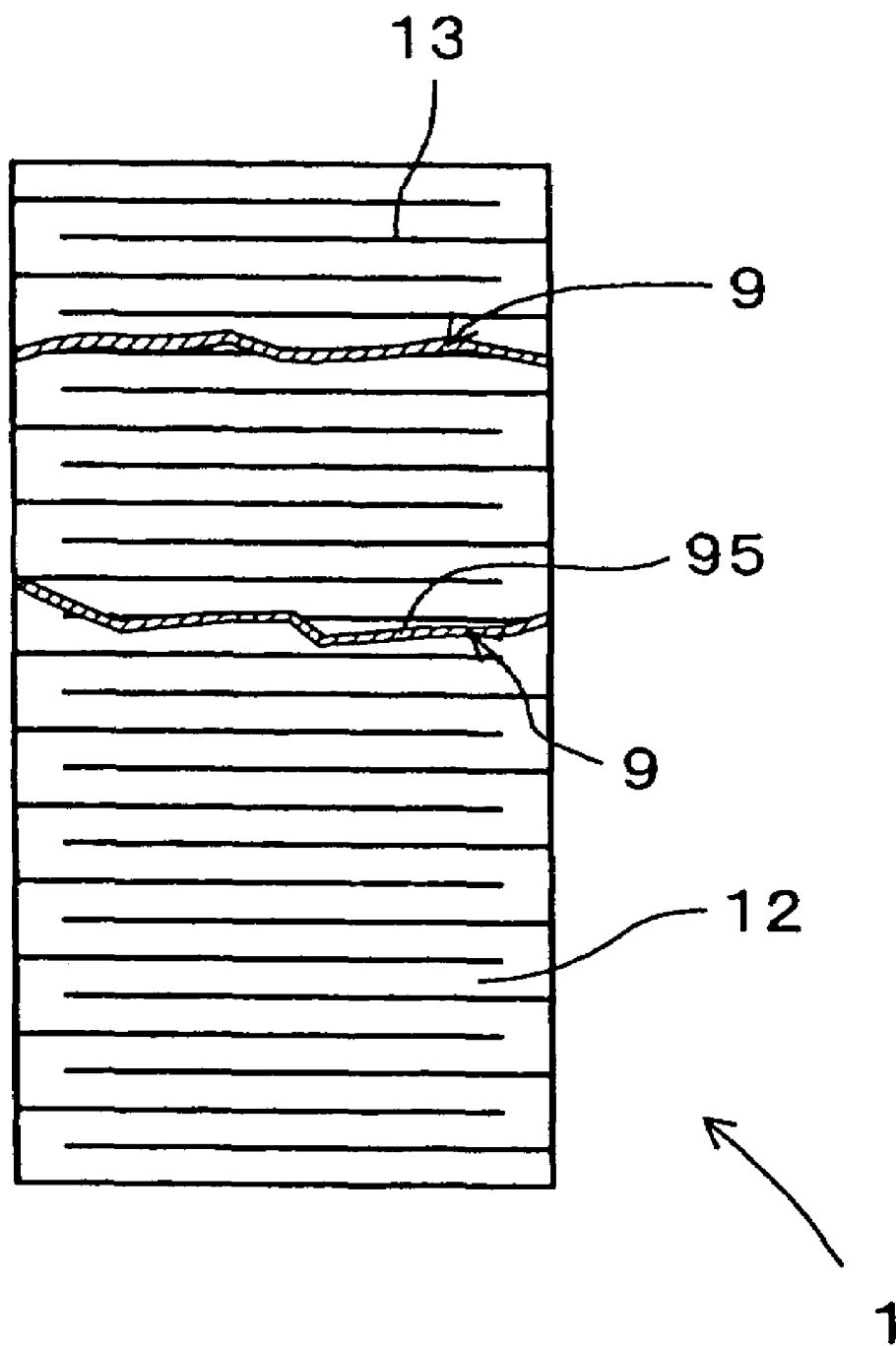
FIG. 13 is a view illustrating delamination that has occurred in the sample C3 according to embodiment 1.

In the sample C3 as shown in FIG. 13, delamination 9 occurred to a large extent in the laminated dielectric element 1. The delamination 9 was such that the base metal electrode layer 13 and the dielectric ceramic layer 12 were peeled off from each other on the interfaces thereof, forming an opening 95.

Figure 14:
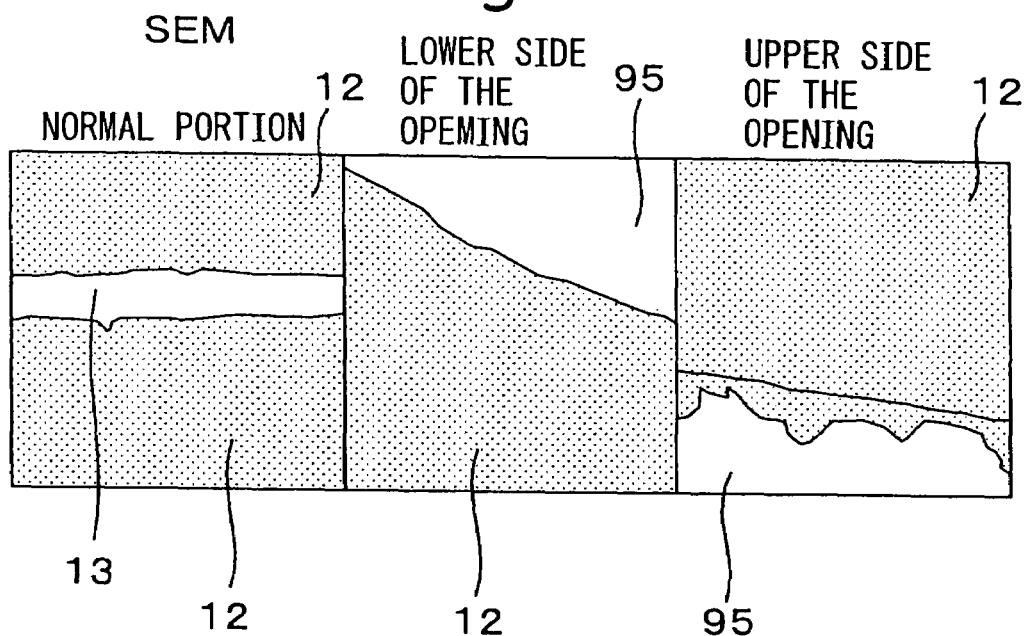
FIG. 14 includes a view (left) illustrating a normal portion of when the sample C3 of embodiment 1 is observed through a scanning microscope, a view (middle) illustrating the lower side of a delaminated opening that is observed, and a view (right) illustrating the upper side of the delaminated opening that is observed.

A portion of the sample C3 where the delamination 9 occurred was observed by using a scanning electron microscope (SEM). The results were as shown in FIG. 14. The middle view of FIG. 14 illustrates the results of when the lower side of the opening 95 caused by the delamination was observed. In this view, the upper portion of the boundary line that runs aslant toward the right lower direction is the opening formed by the delamination, and the lower portion is the dielectric ceramic layer 12. The right view illustrates the results of when the upper side of the opening 95 was observed. The left view of FIG. 14 illustrates, for comparison, the results of when a normal portion without delamination 9 was observed.

Figure 15:
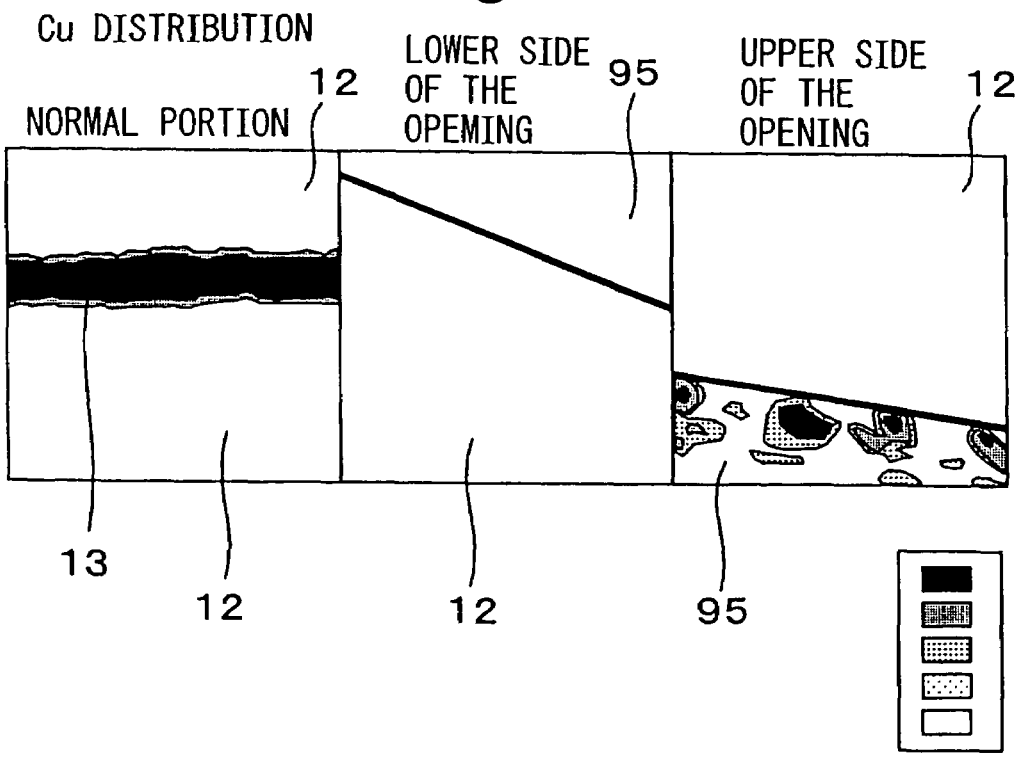
FIG. 15 is a view illustrating the manner of Cu distribution in the same portion as observed by using the scanning microscope illustrated in FIG. 14 according to embodiment 1.

FIG. 15 illustrates the distribution of copper in the same portion as observed by using the SEM.

In the portion of the sample C3 where the delamination occurred as shown in FIGS. 14 and 15, copper was present like beads on the surface of the dielectric ceramic layer 12 on the side of the opening 95.

In the middle and right views of FIG. 15, the inclined solid lines represent a position of the boundary portion between the dielectric ceramic layer 12 and the opening 95.

Next, the samples E1 to E4 and C1 to C3 were measured for their electrostatic capacities and insulation resistances.

(Electrostatic Capacity)

The electrostatic capacity was measured by using an impedance analyzer at room temperature and at a frequency of 1 kHz. The results were as shown in Table 1.

(Insulation Resistance)

The insulation resistance was measured by using an insulation resistance tester at room temperature 2 minutes after the application of a voltage of 150 V. The results were as shown in Table 1.

TABLE 1

| Sample No. | Atmospheric gas conditions | | | Electrostatic capacity (nF) | Insulation resistance (MΩ) |
|---|---|---|---|---|---|
| | Ar—$H_2$ flow rate (ml/min) | Concentration of $H_2$ gas (%) | $O_2$ flow rate (ml/min) | | |
| E1 | 5000 | 0.99 | 8.0 | 1440 | 670 |
| E2 | 5000 | 0.98 | 7.7 | 1386 | 558 |
| E3 | 5000 | 0.94 | 7.0 | 1431 | 627 |
| E4 | 5000 | 0.92 | 6.3 | 1368 | 683 |
| C1 | 5000 | 1.2 | 8.3 | 1.8 | 12750 |
| C2 | 5000 | 0.99 | 8.2 | 603 | 5625 |
| C3 | 5000 | 0.88 | 6.5 | 801 | 11 |

As can be seen from Table 1, the samples E1 to E4 of this embodiment all had large electrostatic capacities of not less than 1300 nF. In addition, the insulation resistance per dielectric ceramic layer was above 550 MΩ.

On the other hand, the samples C1 to C3 had electrostatic capacities of as small as 900 μF or less.

Further, the sample C3 possessed an insulation resistance of as little as 13 MΩ or less.

Embodiment 2.

In this embodiment, the same laminated dielectric elements were fabricated as those of embodiment 1, but the thickness of the paste material applied for the base metal electrodes in the step of printing the electrode was varied, as were the conditions for controlling the atmospheric gas in the step of reducing the electrodes, to measure the electrostatic capacities, insulation resistances and yields.

First were fabricated 26 kinds of the laminated dielectric elements, in the same manner as in the embodiment 1, but with the conditions changed as described above. More specifically, a plurality of laminated dielectric elements were fabricated by varying the thickness (printing thickness) of the paste material applied for the base metal electrodes in the step of printing the electrodes, and varying the hydrogen gas concentration in the Ar—$H_2$ gas, varying the flow rate of oxygen as the oxidizing gas, and varying the maximum holding temperature and the holding time in the step of reducing the electrodes in a manner as shown in Table 2 appearing below. The thus-obtained laminated dielectric elements were labeled as samples E5 to E18 and samples C5 to C16.

Further, the yields were examined under the conditions of fabricating the samples E5 to E18 and the samples C5 to C16.

The samples of each kind were fabricated in a number of 40 and among them, those that developed delamination were regarded as defective products in order to calculate the yield. The results were as shown in Table 2.

Next, the samples E5 to E18 and the samples C5 to C16 were measured for their electrostatic capacities and insulation resistances. The measuring methods were the same as those of the embodiment 1. The results were as shown in Table 2.

For comparison, the sample E1 obtained in Example 1, was also measured for its electrostatic capacity, insulation resistance and yield. The results were as shown in Table 2.

TABLE 2

| Sample No. | Printing thickness (μm) | Ar—$H_2$ flow rate (ml/min) | $H_2$ concentration (%) | $O_2$ flow rate (ml/min) | Max. holding temp. (° C.) | Holding time (h) | Ave electrostatic capacity (nF) | Ave. insulation resistance (MΩ) | Yield (%) |
|---|---|---|---|---|---|---|---|---|---|
| E1 | 6 | 5000 | 0.99 | 8.0 | 330 | 14 | 1440 | 670 | 100 |
| E5 | 9.3 | 5000 | 0.99 | 8.0 | 330 | 14 | 1431 | 620 | 100 |
| E6 | 9.3 | 5000 | 0.95 | 7.0 | 331 | 14 | 1440 | 560 | 100 |
| E7 | 9.3 | 5000 | 0.9 | 5.8 | 329 | 14 | 1467 | 580 | 100 |
| E8 | 12.9 | 5000 | 0.99 | 8.0 | 330 | 14 | 1431 | 550 | 100 |
| E9 | 12.9 | 5000 | 0.95 | 7.1 | 330 | 15 | 1422 | 510 | 100 |
| E10 | 12.9 | 5000 | 0.9 | 6.0 | 329 | 15 | 1443 | 730 | 100 |
| E11 | 14.3 | 5000 | 0.99 | 8.0 | 330 | 15 | 1395 | 530 | 93 |
| E12 | 14.3 | 5000 | 0.95 | 7.2 | 330 | 15 | 1389 | 530 | 93 |
| E13 | 14.3 | 5000 | 0.9 | 6.2 | 329 | 15 | 1458 | 630 | 90 |
| E14 | 14.3 | 5000 | 0.99 | 7.8 | 330 | 15 | 1395 | 530 | 93 |
| E15 | 14.3 | 5000 | 0.99 | 8.0 | 330 | 15 | 1400 | 570 | 93 |
| E16 | 14.3 | 5000 | 0.99 | 8.2 | 329 | 15 | 1440 | 910 | 92 |
| E17 | 13.1 | 5000 | 0.99 | 8.0 | 400 | 0.5 | 1380 | 580 | 90 |
| E18 | 12.6 | 5000 | 0.9 | 6.0 | 400 | 0.5 | 1380 | 600 | 80 |
| C5 | 11.5 | 5000 | 0.99 | 9.0 | 330 | 15 | 1026 | 160 | 10 |
| C6 | 11.5 | 5000 | 0.95 | 8.0 | 331 | 15 | 1170 | 60 | 4 |
| C7 | 11.5 | 5000 | 0.9 | 6.7 | 329 | 15 | 882 | 90 | 6 |
| C8 | 12.9 | 5000 | 0.99 | 7.0 | 330 | 15 | 207 | 5600 | 0 |
| C9 | 12.9 | 5000 | 0.95 | 6.3 | 330 | 15 | 405 | 5050 | 0 |
| C10 | 12.9 | 5000 | 0.9 | 5.3 | 329 | 15 | 108 | 16000 | 0 |
| C11 | 14.3 | 5000 | 0.95 | 2.3 | 330 | 15 | 1.8 | 1000< | 0 |
| C12 | 14.3 | 5000 | 0.95 | 2.3 | 330 | 15 | 0.81 | 1000< | 0 |
| C13 | 14.3 | 5000 | 0.9 | 2.2 | 329 | 15 | 0.9 | 1000< | 0 |
| C14 | 16.2 | 5000 | 0.99 | 7.8 | 330 | 15 | 1395 | 530 | 60 |
| C15 | 15.1 | 5000 | 0.99 | 8.0 | 330 | 15 | 1400 | 570 | 44 |
| C16 | 15.9 | 5000 | 0.99 | 8.2 | 329 | 15 | 1440 | 910 | 40 |

As can be seen from Table 2, the samples E5 to E18 possessed electrostatic capacities and insulation resistances comparable to those of the sample E1, and their yields were not smaller than 80%.

On the other hand, the samples C5 to C16 exhibited degraded electrostatic capacities and insulation resistances.

In particular, when the printing thickness was not less than 16 μm as in the samples C14 to C16, delamination frequently occurred and the yield was poor. This is attributed to the fact that in the step of reducing the electrodes, the paste material for the base metal electrodes is hard to reduce, and the residual Cu oxide diffuses into the dielectric ceramic layers.

Figure 21:
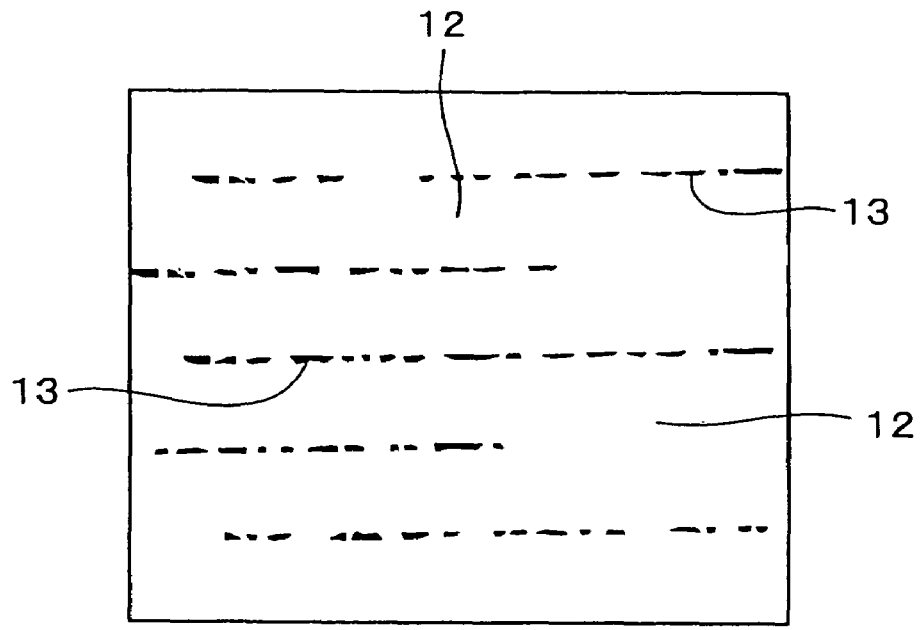
FIG. 21 is a view illustrating the base metal electrode layers that are broken in the laminated dielectric element according to embodiment 2.

Though not illustrated in Table 2, when the thickness of printing was less than 2 μm, the base metal electrode layers 13 broke after the sintering, as illustrated in FIG. 21. This is attributed to the fact that the electrodes were dissolved by lead oxide released from the ceramic material.

Further, though not illustrated in Table 2, in the samples E5 to E18, the amounts of the base metal oxide remaining in the base metal electrode layer 13 were not larger than 20% by weight, and the amounts of lead released from the ceramic material were not larger than 30 atomic % within 5000 Å from the surfaces of the base metal electrode layers 13.

On the other hand, in the samples C5 to C16, the amounts of the base metal oxide remaining in the base metal electrode layers 13 were not smaller than 20% by weight, and the amounts of lead released from the ceramic material were not smaller than 30 atomic % within 5000 Å from the surfaces of the base metal electrode layers 13.

Embodiment 3.

Next described below is the method of producing a laminated dielectric element according to an embodiment of a second invention.

Figure 22:
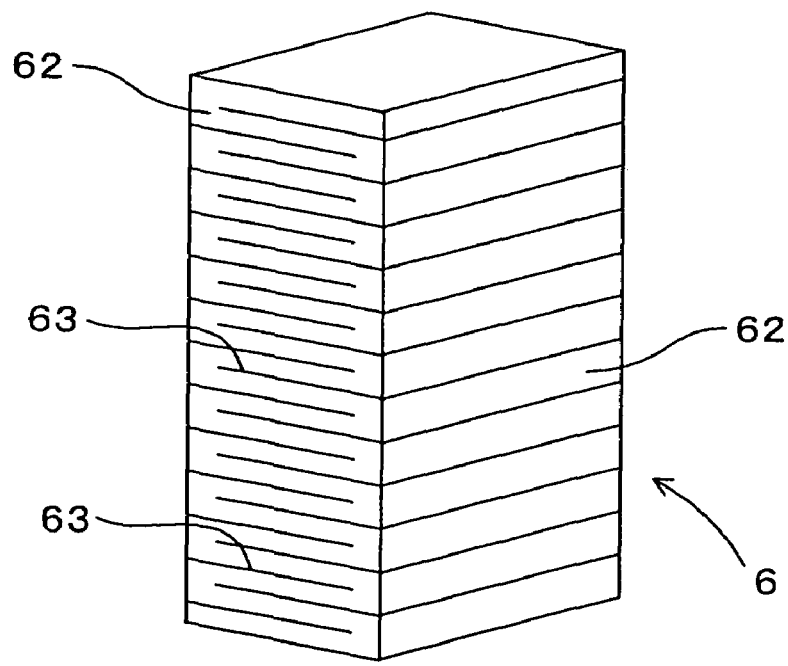
FIG. 22 is a view illustrating the entire laminated dielectric element according to embodiment 3.

In this embodiment, as illustrated in FIG. 22, a laminated dielectric element 6 is produced by alternately laminating dielectric ceramic layers 62 and base metal electrode layers 63 of a base metal.

As will be described later, the method of production of this embodiment includes a step of printing electrodes, a step of press-adhesion, a step of dewaxing, a step of reducing the electrodes and a step of sintering.

The step of printing the electrodes is for applying a paste material for the base metal electrodes containing a base metal oxide onto the surfaces of at least one side of ceramic green sheets obtained by molding a ceramic material of a metal oxide into the shape of a sheet.

The step of press-adhesion is for fabricating a laminate by laminating and press-adhering ceramic green sheets onto which the paste material for the base metal electrodes has been applied.

The step of dewaxing is for dewaxing the laminate.

The step of reducing the electrodes is for forming base metal electrode layers by reducing the paste material for the base metal electrodes by heating the laminate in a heating furnace while flowing the atmospheric gas.

The step of sintering is for sintering the laminate.

The atmospheric gas in the step of reducing the electrodes in this embodiment contains a reducing gas for reducing the paste material for the base metal electrodes and an oxidizing gas of oxygen and/or a gas that forms oxygen.

In the step of reducing the electrodes, the heating is conducted with the temperature near a eutectic point of the base metal in the paste material for the base metal electrodes and of at least one metal in the ceramic green sheet as a maximum holding temperature, and the reducing gas at the maximum holding temperature is contained in an amount of 0.2 to 3% by volume in the atmospheric gas.

A method of production of the embodiment will now be described in detail.

First, a paste material for the base metal electrodes is prepared as described below.

There are prepared a plate-like Cu powder in the form of a plate by pressing a Cu powder of nearly a spherical shape having an average particle size of 0.5 μm, and a CuO powder of nearly a spherical shape having an average particle size of 1 to 2 μm.

There is further prepared a co-material which is the same material as the ceramic material of the embodiment 1, but from which the amount of Pb has been decreased by 2 atomic %.

Next, 18.3% by weight of an ethyl cellulose as a resin material, 79.3% by weight of a butyl carbitol as a solvent and 0.7% by weight of a higher fatty acid as a dispersing material, were mixed together to prepare a base material of the paste material for the base metal electrodes.

To the base material, there were added the CuO powder (average particle size of 1 to 2 μm, nearly spherical shape) prepared in advance as described above, the plate-like Cu powder (average particle size of 0.5 μm, nearly spherical shape) and the co-material at a ratio as shown in Table 3. The mixture was then kneaded to prepare a paste material for the base metal electrodes.

TABLE 3

Composition of paste material for the base metal electrodes

| Base material | CuO powder | Plate-like Cu powder | Co-material | Sub-total |
|---|---|---|---|---|
| 30 wt % | 30 wt % | 37 wt % | 3 wt % | 100 wt % |

Next, there was prepared a slurry of a ceramic material of the same composition as that of embodiment 1 in the same manner thereas. The slurry of the above ceramic material was molded into a sheet by the same doctor blade method as that of embodiment 1 to prepare a ceramic green sheet.

Then, the paste material for the base metal electrodes was printed onto the ceramic green sheets in the same manner as in embodiment 1. The ceramic green sheets on which the paste material for the base metal electrodes has been printed were laminated and press-adhered in such a manner that the base metal paste material alternately reached the right and left side surfaces, and were cut into a predetermined size in the same manner as in embodiment 1. In this embodiment, there was fabricated a 2-mm laminate (80 μm/layer) suppressing the number of laminated layers to 25 layers in order to shorten the dewaxing time in the step of dewaxing.

Then, the laminate was dewaxed in the same manner as in embodiment 1.

Next, there was conducted the step of reducing the electrode. In this embodiment, the ceramic green sheet contains lead in the composition, and the paste material for the base metal electrodes contains copper. Therefore, a temperature near 326° C., which is a eutectic point of lead and of copper, was set to be a maximum holding temperature, and the heating was conducted for 12 hours.

Further, at the time of heating, the atmospheric gas was introduced into the furnace chamber 30 of the heating furnace 3. The atmospheric gas that was introduced comprised of Ar—$H_2$ and $O_2$. The concentration of hydrogen gas in Ar—$H_2$ was 1%. In introducing the atmospheric gas, the flow rate of Ar—$H_2$ was 5000 ml/min and the flow rate of $O_2$ was 5 to 10 ml/min. Through the step of reducing the electrodes, the paste material for the base metal electrodes printed onto the ceramic green sheets was reduced to form the base metal electrode layers.

In the step of reducing the electrodes, the oxygen partial pressure was set to be $10^{-23.8}$ atm at the maximum holding temperature.

Next, the laminate after the step of reducing the electrode was sintered by using the same heating furnace 3 as the one used in the step of reducing the electrodes.

In this embodiment, the laminate was sintered at a sintering temperature of 950° C. for 4 hours while flowing the atmospheric gas. Here, the atmospheric gas comprised of Ar—$H_2$ (reducing gas) and $O_2$ (oxidizing gas) like in the step of reducing the electrodes. In this embodiment, however, the atmospheric gas was so adjusted that the dielectric ceramic layers were not reduced. The oxygen partial pressure at the time of sintering was set to be about $10^{-6}$ at a temperature of 950° C.

Thus, as shown in FIG. 22, the laminated dielectric element 6 was fabricated by alternately laminating the dielectric ceramic layers 62 and the base metal electrode layers 63 of a base metal, and was labeled as sample X1.

Further, in this embodiment, there was fabricated a laminated dielectric element (sample Y1) for comparison in the same manner as the sample X1, but using Ar—$H_2$ containing 1% of hydrogen gas, $O_2$ and $N_2$ as an atmospheric gas in the step of reducing the electrodes. In fabricating the sample Y1, the step of reducing the electrodes was conducted while flowing Ar—$H_2$ at a flow rate of 1000 ml/min, $O_2$ at a flow rate of 5 to 10 ml/min, and $N_2$ at a flow rate of 4000 ml/min.

Next, the samples X1 and Y1 were cut along the surfaces perpendicular to the dielectric ceramic layers, and the distributions of copper atoms and oxygen atoms on the cut surfaces were analyzed and compared by EPMA.

Figure 23:
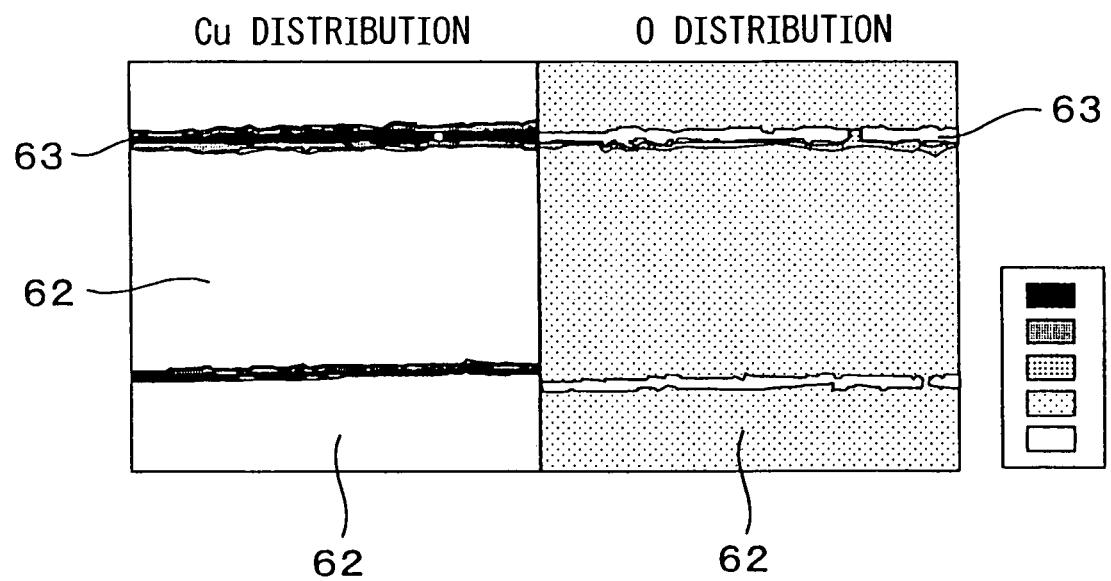
FIG. 23 is a view illustrating a state of distribution of copper and oxygen atoms in a sample X1 according to embodiment 3.
Figure 24:
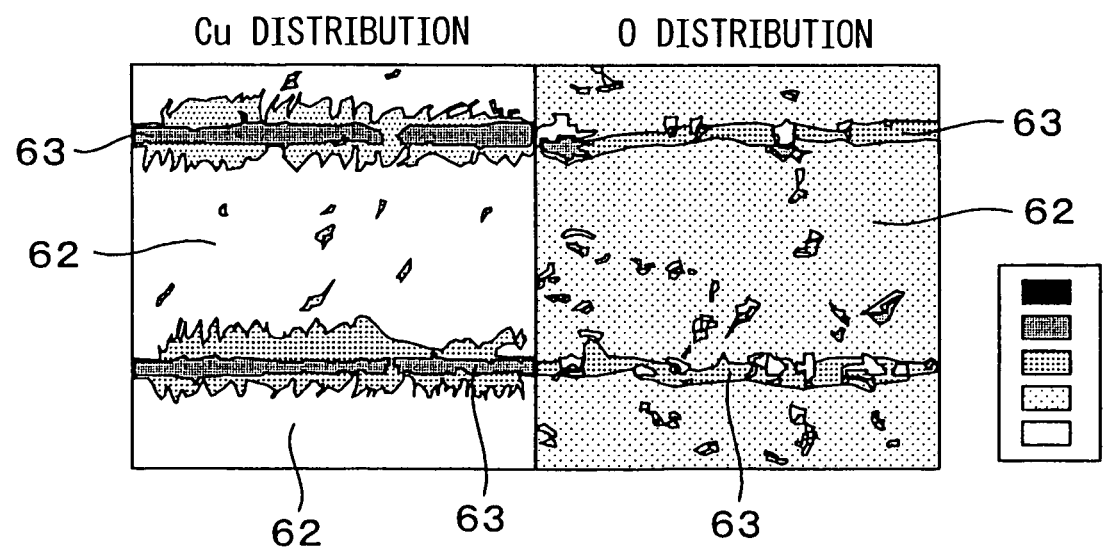
FIG. 24 is a view illustrating a state of distribution of copper and oxygen atoms in a sample Y1 according to embodiment 3.

The results were as shown in FIG. 23 (sample X1) and FIG. 24 (sample Y1).

In the sample X1, as can be seen from FIG. 23, oxygen was scarcely distributed in the base metal electrode layers 63 in which copper was distributed. Specifically, it can be seen that in the step of reducing the electrodes, the paste material for the base metal electrodes was reduced to a sufficient degree. Further, in the sample X1, no delamination occurred.

On the other hand, in the sample Y1, as can be seen from FIG. 24, oxygen was distributed in the base metal electrode layers 63, too, in which copper was distributed. Specifically, it can be seen that in the sample Y1, the paste material for the base metal electrodes was reduced to a very low degree as compared to the sample X1.

Thus, the method of production of this embodiment makes it possible to produce a laminated dielectric element of high quality, free of delamination.

Embodiment 4.

In this embodiment, there were fabricated the same laminated dielectric elements as those of embodiment 3 but varying the temperature and the atmospheric gas conditions in the step of reducing the electrodes in the embodiment 3.

First, there were fabricated six 2-mm laminated dielectric elements in the same manner as in embodiment 3, which were then dewaxed in the same manner thereas.

Next, the six dewaxed laminates were subjected to the step of reducing the electrodes and to the step of sintering in the same manner as in embodiment 3 to fabricate the laminated dielectric elements.

In the step of reducing the electrodes of this embodiment, a maximum holding temperature was set to 330° C., and the heating was conducted for 12 hours. The heating was conducted while flowing the atmospheric gas like in embodiment 3. In this embodiment, the total flow rate of the atmospheric gas was adjusted to be 5005 to 5010 ml/min, and the above six laminates were heated while varying the proportion of the hydrogen gas in the atmospheric gas, followed by sintering in the same manner as in embodiment 3 to thereby obtain six laminated dielectric elements which were labeled as samples X2 to X5, sample Y2 and sample Y3. The ratios of the hydrogen gas of when the samples X2 to X5, the sample Y2 and the sample Y3 were fabricated, were as shown in Table 4 appearing later.

For the samples X2, X5 and Y2 fabricated under the atmospheric condition of an $H_2$ gas ratio of not smaller than 1%, there were used the Ar—$H_2$ gas and the oxygen gas as the atmospheric gas. The flow rate of the Ar—$H_2$ gas was adjusted in the atmospheric gas, or the ratio of the Ar gas and the $H_2$ gas was adjusted in the Ar—$H_2$ gas, so that the atmospheric gas flowed at a flow rate of 5000 ml/min to establish an atmospheric condition in which the ratio of the $H_2$ gas in the atmospheric gas was not larger than 1%. The oxygen gas was permitted to flow at a rate of 5 to 10 ml/min into the atmospheric pressure gas, so that the flow rate of the total atmospheric gas was 5005 to 5010 ml/min.

For the samples X3, X4 and Y1 fabricated under the atmospheric condition of an $H_2$ gas ratio of smaller than 1%, there were used the Ar—$H_2$ gas, the oxygen gas and the $N_2$ gas as the atmospheric gas. The Ar—$H_2$ gas and the $N_2$ gas were adjusted in the atmospheric gas, so that the ratio of the $H_2$ gas in the atmospheric gas was smaller than 1%. The total flow rate of the Ar—$H_2$ gas and the $N_2$ gas was adjusted to be 5000 ml/min and the oxygen gas was permitted to flow at a rate of 5 to 10 ml/min, so that the flow rate of the total atmospheric gas was 5005 to 5010 ml/min.

The thus fabricated samples X2 to X5, Y1 and Y2 were examined for their amounts of Cu oxide remaining in the base metal electrode layers and the ratio of formation of eutectic substance in the dielectric ceramic layers.

The remaining amount of the Cu oxide represents the amount of the Cu oxide remaining in the base metal electrode layers after the step of reducing the electrodes. When the Cu oxide remains in large amounts, the conductivity of the base metal electrode layers may so decrease that the dielectric element is no longer useful.

During the step of reducing the electrodes and during the step of sintering, Cu, CuO or $Cu_2O$ contained in the base metal electrode layers may react with Pb, PbO or $PbO_2$ released from the dielectric ceramic layers to form a eutectic material $Cu_6PbO_8$ of Cu and Pb. The eutectic material that is formed in large amounts may infiltrate into the dielectric ceramic layers. The eutectic material, in many cases, is not a piezoelectric material and degrades the piezoelectric characteristics. Alternatively, it could become a cause of generating noise when the dielectric element is driven.

Described below are the methods of measuring the remaining amount of the Cu oxide and the ratio of formation of the eutectic material.

Remaining Amount of Cu Oxide.

The laminated dielectric elements (samples X2 to X5, sample Y1 and sample Y2) after sintering were peeled on the interface between the dielectric ceramic layer and the base metal electrode layer, and the film of the base metal electrode layer was adhered to a tape and was measured by using an X-ray diffraction apparatus (XRD-6100 manufactured by Shimazu Seisakusho Co.). The measurement was based on a simplified determining calculation (calculation of an identified compound having a corundum ratio), and the results were obtained as ratios of the amounts of copper and copper oxide.

The remaining amounts of copper oxide were thus measured, and the results were as shown in Table 4.

Formation of the Eutectic Material.

Like in the case of measuring the remaining amount of copper oxide, the film of the base metal electrode layer was adhered to a tape and was measured on the side of the dielectric ceramic layer by using the above X-ray diffraction apparatus. The measurement was based on the simplified determining calculation, and the results were obtained as ratios of the amounts of $Cu_6PbO_8$ and Pb oxide.

The ratio of formation of the eutectic material ($Cu_6PbO_8$, etc.) was thus measured, and the results were as shown in Table 4.

In Table 4, the remaining amounts of Cu oxide and the ratio of formation of the eutectic material are represented by the ratios (atomic %) of the numbers of atoms.

TABLE 4

| Sample No. | Total flow rate of atmospheric gas excluding $O_2$ gas (ml/min) | Ratio of $H_2$ in atmospheric gas (%) | Flow rate of $H_2$ gas (ml/min) | Linear density of $H_2$ gas (cm/min) | Remaining amount of Cu oxide (%) | Ratio of formation of eutectic material of Pb and Cu (%) |
|---|---|---|---|---|---|---|
| Ex. 4 | | | | | | |
| X2 | 5000 | 1.0 | 50 | 0.188 | 0 | 11 |
| X3 | 5000 | 0.8 | 40 | 0.150 | 0 | 17 |
| X4 | 5000 | 0.5 | 25 | 0.0940 | 1 | 18.3 |
| X5 | 5000 | 1.5 | 75 | 0.282 | 0 | 12.3 |
| Y1 | 5000 | 0.2 | 10 | 0.0376 | 95 | 32.3 |
| Y2 | 5000 | 3.0 | 150 | 0.564 | 0 | 29.6 |
| Ex. 5 | | | | | | |
| X6 | 1000 | 1.0 | 10 | 0.0376 | 0 | 13 |
| X7 | 7500 | 2.0 | 150 | 0.564 | 0 | 15.7 |
| Ex. 6 | | | | | | |
| X8 | 10000 | 0.2 | 20 | 0.0752 | 1 | 18.8 |
| X9 | 2000 | 3.0 | 60 | 0.226 | 0 | 16.3 |

In the samples X2 to X5, as can be seen from Table 4, the remaining amount of Cu oxide and the ratio of formation of the eutectic material were very small.

In the sample Y1, on the other hand, the Cu oxide was formed in a very large amount in the base metal electrode layers, and the eutectic material of Pb and Cu was formed at a large ratio. In the sample Y2, too, the eutectic material was formed at a large ratio.

The results will now be studied.

In this embodiment, the samples X2 to X5, sample Y1 and sample Y2 were fabricated by varying the ratio of the $H_2$ gas in the atmospheric gas in the step of reducing the electrodes.

Here, the sample Y1 was fabricated under a condition of the $H_2$ gas ratio of as low as 0.2%. When the hydrogen gas concentration was as low as above, the paste material for the base metal electrodes was not sufficiently reduced in the step of reducing the electrodes, and the Cu oxide remained as shown in Table 4. Further, in the step of sintering after the step of reducing the electrodes, the Cu oxide, such as CuO, that remained formed a eutectic material with PbO in the dielectric ceramic layers. As a result, the eutectic material was formed at a large ratio as shown in Table 4.

The sample Y2 was fabricated under a condition of the $H_2$ gas proportion of as high as 3.0%. When the hydrogen gas concentration was as high as above, not only the paste material for the base metal electrodes, but also the ceramic green sheets were reduced in the step of reducing the electrodes, and Pb was released. Pb that was released formed a eutectic material with Cu in the base metal electrode layer; i.e., the eutectic material was formed in a high proportion as shown in Table 4.

As described above, the eutectic material may be formed under a reducing condition which is too strong or too weak in the step of reducing the electrodes. As can be seen from Table 4, it is desirable that the ratio of the $H_2$ gas in the atmospheric gas be set to be not smaller than 0.2%, but not larger than 3.0% in the step of reducing the electrodes.

Referring to FIG. 7, further, the heating furnace 3 used in the step of reducing the electrodes has a furnace chamber 30 of a cylindrical shape the sectional shape of which is nearly a circle of a diameter of 184 mm having a perpendicular line in a direction in which the atmospheric gas proceeds. Therefore, as shown in Table 4 above, the ratio of $H_2$ gas in the atmospheric gas can be converted into a linear density of $H_2$ gas (flow rate of $H_2$ gas÷sectional area of the passing medium (furnace chamber)). However, in Table 4, the flow rate of oxygen contained in very small amounts in the atmospheric gas is not taken into account.

Studying the results of Table 4 from the standpoint of the linear density of the $H_2$ gas, it is desirable that the linear density of the $H_2$ gas in the atmospheric gas be not smaller than 0.0376 cm/min, but not larger than 0.564 cm/min in the step of reducing the electrodes.

Embodiment 5.

This embodiment further studies the range of preferred ratios of the hydrogen gas in the atmospheric gas studied in the above embodiment 4.

First, like in embodiments 3 and 4, two 2-mm laminates were fabricated and were dewaxed.

Next, the two dewaxed laminates were subjected to the step of reducing the electrodes and to the step of sintering in the same manner as in embodiments 3 and 4 to fabricate the laminated dielectric elements.

In the step of reducing the electrodes in this embodiment, the atmospheric gas was permitted to flow at the time of heating like in the above embodiment 3. Here, in this embodiment, the two laminates were heated while varying the linear density of the hydrogen gas in the atmospheric gas in a manner as described below.

In the step of reducing the electrodes, the first laminate was heated under the conditions of flowing the Ar—$H_2$ gas containing 1% of hydrogen gas as the atmospheric gas at a rate of 1000 ml/min and flowing the oxygen gas for adjusting the oxygen partial pressure at a rate of 1 to 4 ml/min (the flow rate of the total atmospheric gas was 1001 to 1004 ml/min) at a maximum holding temperature of 320° C. for 8 hours. The heating furnace in this case was the same as that of embodiment 4, and hence the linear density of the hydrogen gas in the atmospheric gas was 0.0376 cm/min. Then, the sintering was conducted in the same manner as embodiments 3 and 4 to obtain a laminated dielectric element which was labeled as sample X6.

Another laminate was heated under the conditions of flowing the Ar—$H_2$ gas containing 2% of hydrogen gas as the atmospheric gas at a rate of 7500 ml/min and flowing the oxygen gas at a rate of 8 to 15 ml/min (the flow rate of the total atmospheric gas was 7508 to 7515 ml/min) at a maximum holding temperature of 330° C. for 12 hours. The heating furnace in this case was the same as that of embodiment 4, and hence the linear density of the hydrogen gas in the atmospheric gas was 0.564 cm/min. Then, the sintering was conducted in the same manner as embodiments 3 and 4 to obtain a laminated dielectric element which was labeled as sample X7.

Then, the samples X6 and X7 were measured for their amounts of Cu oxide remaining in the base metal electrode layers and the ratio of formation of the eutectic material of Pb and Cu in the same manner as in embodiment 4.

The results were as shown in Table 4.

The method of calculating the linear density of the $H_2$ gas in Table 4 was the same as that of the embodiment 4, without taking into consideration the flow rate of a small amount of oxygen gas contained in the atmospheric gas.

In the samples X6 and X7, as can be seen from Table 4, the amounts of Cu oxide were 0%, and the eutectic material was formed at relatively small ratios.

In the above embodiment 4, the range of preferred linear densities of $H_2$ gas was specified to be a lower limit of 0.0376 cm/min and an upper limit of 0.564 cm/min. However, the samples X6 and X7 of this embodiment were fabricated by using the $H_2$ gas of a linear density lying outside the above range. Nevertheless, the amounts of Cu oxide and the ratios of formation of the eutectic material in the samples X6 and X7 were suppressed to be low, as shown in Table 4, because the $H_2$ ratio in the atmospheric gas was set to lie in a range of not smaller than 0.2 but not larger than 3.0, as described above.

According to this embodiment as described above, it is important that the content of the hydrogen gas as the reducing gas in the atmospheric gas be set to not smaller than 0.2% but not larger than 3.0% in the step of reducing the electrodes.

Embodiment 6.

This embodiment further studies the range of preferred linear densities of the hydrogen gas.

First, like in embodiment 5, two 2-mm laminates were fabricated and were dewaxed.

Next, the two dewaxed laminates were subjected to the step of reducing the electrodes and to the step of sintering in the same manner as in embodiment 5 to fabricate the laminated dielectric elements.

In the step of reducing the electrodes in this embodiment, the two laminates were heated while varying the ratio of the hydrogen gas in the atmospheric gas in a manner as described below.

In the step of reducing the electrodes, the first laminate was heated under the conditions of flowing, as the atmospheric gas and at a rate of 10000 ml/min, a mixed gas obtained by mixing the $N_2$ gas into the Ar—$H_2$ gas containing 1% of hydrogen gas such that the ratio of the hydrogen gas was 0.2%, and flowing the oxygen gas for adjusting the oxygen partial pressure at a rate of 10 to 20 ml/min (the flow rate of the total atmospheric gas was 10010 to 10020 ml/min) at a maximum holding temperature of 332° C. for 16 hours. The heating furnace in this case was the same as that of embodiment 4, and hence the linear density of the hydrogen gas in the atmospheric gas was 0.0752 cm/min. Then, the sintering was conducted in the same manner as embodiments 3 and 4 to obtain a laminated dielectric element which was labeled as sample X8.

Another laminate was heated under the conditions of flowing the Ar—$H_2$ gas containing 3% of hydrogen gas as the atmospheric gas at a rate of 2000 ml/min, and flowing the oxygen gas at a rate of 2 to 5 ml/min (the flow rate of the total atmospheric gas was 2002 to 2005 ml/min) at a maximum holding temperature of 330° C. for 12 hours. The heating furnace in this case was the same as that of embodiment 4, and hence the linear density of the hydrogen gas in the atmospheric gas was 0.226 cm/min. Then, the sintering was conducted in the same manner as embodiments 3 and 4 to obtain a laminated dielectric element which was labeled as sample X9.

Then, the samples X8 and X9 were measured for their amounts of Cu oxide remaining in the base metal electrode layers and the ratio of formation of the eutectic material of Pb and Cu in the same manner as in embodiment 4.

The results were as shown in Table 4.

The method of calculating the linear density of the $H_2$ gas in Table 4 was the same as that of embodiment 4, without taking into consideration the flow rate of a small amount of oxygen gas contained in the atmospheric gas.

In the samples X8 and X9, as can be seen from Table 4, the amounts of Cu oxide were as small as 1% and 0%, and the eutectic material was formed at relatively small ratios.

In the above embodiment 4, the range of preferred $H_2$ gas ratios in the atmospheric gas was specified to be not smaller than 0.2%, but smaller than 3%. However, the samples X8 and X9 of this embodiment were fabricated at $H_2$ gas ratios outside the above range. Nevertheless, the amounts of Cu oxide and the ratios of formation of the eutectic material in the samples X8 and X9 were suppressed to be low as shown in Table 4, because the linear densities of the $H_2$ gas in the atmospheric gas were set to lie in a range of not smaller than 0.0376 cm/min, but not larger than 0.564 cm/min as described above.

According to this embodiment as described above, it is important that the linear density of the hydrogen gas as the reducing gas in the atmospheric gas be set to lie in a range of not smaller than 0.0376 cm/min, but not larger than 0.564 cm/min in the step of reducing the electrodes.

From the results of embodiments 5 and 6, it can seen that it is important to set the ratio of the hydrogen gas in the atmospheric gas to be not smaller than 0.2% but smaller than 3%, or to set the linear density of the hydrogen gas in the atmospheric gas to lie in a range of not smaller than 0.0376 cm/min, but not larger than 0.564 cm/min in the step of reducing the electrodes.

Embodiment 7.

This embodiment studies the heating temperature in the step of reducing the electrodes.

First, in this embodiment, a laminated dielectric element was fabricated by the same method and under the same conditions as those of fabricating the sample X9 of embodiment 6, with the exception of setting the maximum holding temperature to be 310° C. and the heating time to be 12 hours in the step of reducing the electrodes. The obtained laminated dielectric element was labeled as a sample Y3.

Another laminated dielectric element was fabricated under the same conditions as those of the above sample Y3, but at a maximum holding temperature which only was a difference in the step of reducing the electrodes. This laminated dielectric element was labeled as a sample Y4. In the sample Y4, the maximum holding temperature was 340° C.

Then, the samples Y3 and Y4 were measured for their amounts of Cu oxide remaining in the base metal electrode layers and the ratio of formation of the eutectic material of Pb and Cu in the same manner as in embodiments 4 to 6.

In the sample Y3, nearly 100% of the Cu oxide remained in the base metal electrode layers.

Observation of the sample Y4 by the naked eye revealed that the base metal electrode layers had already been disappeared after the step of reducing the electrodes, and the dielectric ceramic layers only had been laminated.

In the step of reducing the electrodes, as described above, the heating is conducted with the temperature near a eutectic point of the base metal in the paste material for the base metal electrodes and of at least one metal in the ceramic green sheets as a maximum holding temperature. In particular, when the PZT material is used as the ceramic material and copper as the base metal electrode layers, the lower limit of the maximum holding temperature is 310° C. which is lower by 16° C. than 326° C., which is the eutectic point of Pb and Cu, and the upper limit of the maximum holding temperature is 340° C., which is higher by 14° C. than the above eutectic point.

What is claimed is:

1. A method of producing a laminated dielectric element by alternately laminating dielectric ceramic layers containing lead in the composition thereof and base metal electrode layers of a base metal, comprising the steps of:

printing electrodes by applying a paste material for the base metal electrodes containing an oxide of a base metal onto the surfaces of at least one side of the ceramic green sheets obtained by molding a ceramic material of a metal oxide containing a lead oxide into the form of a sheet;

laminating and press-adhering the ceramic green sheets onto which the paste material for the base metal electrodes is applied to fabricate a laminate thereof;

reducing the electrodes to form base metal electrode layers by heating the laminate in a heating furnace while flowing an atmospheric gas and by reducing the paste material for the base metal electrodes; and sintering the laminate;

wherein in the step of reducing the electrodes, the paste material for the base metal electrodes is so reduced that the amount of the base metal oxide remaining in the base metal electrode layers is not larger than 20% by weight and that the amount of lead liberated from the ceramic material is not larger than 30 atomic % within 5000 Å from the surfaces of the base metal electrode layers.

2. The method of producing a laminated dielectric element according to claim 1, wherein the atmospheric gas in the step of reducing the electrodes contains a reducing gas for reducing the paste material for the base metal electrodes and an oxidizing gas of oxygen and/or a gas that forms oxygen.

3. The method of producing a laminated dielectric element according to claim 2, wherein the reducing gas is hydrogen and the oxidizing gas is oxygen.

4. The method of producing a laminated dielectric element according to claim 3, wherein, in the step of reducing the electrodes, the heating starts at a temperature-raising rate of not larger than 200° C./h, a maximum holding temperature is maintained at 300° C. to 400° C. for 0.5 to 15 hours, the furnace is cooled, and the laminate is taken out from the heating furnace at a temperature of not higher than 90° C. while maintaining the oxygen partial pressure in the atmospheric gas to be from $1 \times 10^{-23.9}$ to $1 \times 10^{-22}$ atm from the start of heating until the laminate is taken out from the heating furnace.

5. The method of producing a laminated dielectric element according to claim 3, wherein if the total amount of flow rates of gases constituting the atmospheric gas is regarded to be the total flow rate F (ml/mm), then, an oxygen flow rate $f_O$ (ml/mm) and a hydrogen flow rate $f_H$ (ml/mm) in the step of reducing the electrodes have a relationship of oxygen flow rate $f_O = A \times$ hydrogen flow rate $f_H$/total flow rate $F - B$ (where $20 \leq A \leq 24$, $12 \leq B \leq 16$, $8 \leq A - B \leq 8.22$).

6. The method of producing a laminated dielectric element according to claim 5, wherein, in holding the maximum temperature in the step of reducing the electrodes, if the molar flow rate of water formed by the reaction of hydrogen with oxygen is denoted by w and the molar flow rate of excess of hydrogen that is remaining by H, the values of the two molar flow rates lie within the following ranges, $0.0012 \leq H. \leq 0.0018$ (H: mols/min)

$0.0002 \leq W \leq 0.001$ (W: mols/min).

7. The method of producing a laminated dielectric element according to claim 6, wherein, in holding the maximum temperature in the step of reducing the electrodes, an integrated value h of the molar flow rate of hydrogen during the holding time lies within the following range, $29000 \leq h \leq 31000$ (h: mols/min).

8. The method of producing a laminated dielectric element according to claim 1, wherein, in the step of printing electrodes, the paste for the base metal electrodes is applied maintaining a thickness of 2 to 14 μm.

9. The method of producing a laminated dielectric element according to claim 1, wherein the step of reducing the electrodes and the step of sintering are simultaneously conducted by one heating.

10. The method of producing a laminated dielectric element according to claim 1, wherein the base metal is copper.

11. The method of producing a laminated dielectric element according to claim 1, wherein after the step of press-adhesion, the step of dewaxing is conducted to remove organic materials contained in the laminate.

* * * * *